United States Patent [19]
Rittie et al.

[11] Patent Number: 5,917,730
[45] Date of Patent: Jun. 29, 1999

[54] COMPUTER IMPLEMENTED OBJECT ORIENTED VISUALIZATION SYSTEM AND METHOD

[75] Inventors: Kevin J. Rittie, Reisterstown; Michael Chmilewski, Taneytown; Jeff Walsh, Glen Arm; Alan MacAnespie, Bel Air, all of Md.

[73] Assignee: GSE Process Solutions, Inc., Columbia, Md.

[21] Appl. No.: 08/698,584

[22] Filed: Aug. 16, 1996

Related U.S. Application Data

[60] Provisional application No. 60/002,411, Aug. 17, 1995.

[51] Int. Cl.$^6$ ...................................................... G06F 17/00
[52] U.S. Cl. ................................................................ 364/578
[58] Field of Search ............................................... 367/578

[56] References Cited

U.S. PATENT DOCUMENTS

| | | | |
|---|---|---|---|
| 3,919,720 | 11/1975 | Alliston | 364/578 |
| 4,977,529 | 12/1990 | Gregg et al. | 364/578 |
| 5,163,131 | 11/1992 | Row et al. | 395/200.32 |
| 5,305,221 | 4/1994 | Atherton | 364/578 |
| 5,315,530 | 5/1994 | Gerhardt et al. | 364/578 |
| 5,418,710 | 5/1995 | Ono et al. | 364/578 |
| 5,490,096 | 2/1996 | Seto | 364/578 |
| 5,655,067 | 8/1997 | Takahashi et al. | 395/173 |
| 5,666,297 | 9/1997 | Britt et al. | 364/578 |
| 5,680,590 | 10/1997 | Parti | 395/500 |

OTHER PUBLICATIONS

A. Boxer, "Where Buses Cannot Go", IEEE Spectrum, Feb. 1995, pp. 41–45.

L.A. Barroso et al., "RPM: A Rapid Prototyping Engine for Multiprocessor Systems", IEEE Computer, Feb. 1995, pp. 26–34.

*Primary Examiner*—Vincent N. Trans
*Attorney, Agent, or Firm*—Irah H. Donner; Pepper Hamilton LLP

[57] ABSTRACT

A computer architecture for executing a simulation model which describes characteristics of a physical system. The computer architecture includes an editor processor that prompts a user to define a graphical object (GO) representing static properties of the physical system, and that prompts the user to define dynamic variables of the physical system. The computer architecture also includes a compiler for binding the dynamic variables of the physical system to a physical data source. The physical data source provides dynamic properties of the physical system over time as values for the dynamic variables. The computer architecture also includes a run time processor that executes the simulation model and displays the graphical object with the dynamic properties of the physical system.

22 Claims, 24 Drawing Sheets

| RENAMED VARIABLES | | |
|---|---|---|
| SUBMODEL | FUNDAMENTAL_SGO | VARIABLES |
| | | CONSTANTS |
| | MODEL VARIABLE | INSTANCE EXPRESSION |
| | EPN | #-ENTACB001 S3_ONLINE# |
| | NegColor | |
| | PosColor | |
| | ZeroColor | |
| | cur_value | |

HOLD
RELEASE
CLEAR
ACCEPT
PRINT
DONE
ESCAPE

FIG. 21

COMPUTER IMPLEMENTED OBJECT ORIENTED VISUALIZATION SYSTEM AND METHOD

RELATED APPLICATIONS

This application claims priority from U.S. provisional application serial No. 60/002,411 filed on Aug. 17, 1995 entitled "SGOs and PRIZM," the content of which is hereby incorporated by reference.

TECHNICAL FIELD

The present invention relates generally to visualization systems used to execute and analyze dynamic models of physical systems implemented by a computer system, and more particularly, to object oriented computer implemented visualization methodology that analyzes dynamic models of physical systems. The invention also provides the capability of monitoring a physical system responsive to the dynamic model, and of re-designing the physical system via analysis of the executed models.

BACKGROUND ART

In general, there has been a considerable amount of emphasis and/or research to accurately and efficiently monitor, control and analyze complex industrial systems. The disciplines of industrial engineering and systems engineering were, in part, formed as a result of specific requirements and/or knowledge required to address the above mentioned concerns.

To that end, one major field that has developed within the systems engineering discipline is the field of control engineering. The control engineering field seeks to find better ways to control, for example, physical industrial systems. The well known concept of feedback control provides the capability for accurate control of industrial systems by feeding back the control error from the desired or reference control point. The feedback of the error is commonly called negative feedback.

Control engineering has developed over the years many different types of controllers that predict future system behavior and provide inputs/controls to prevent unwanted behavior and to encourage desired behavior. One notoriously well known example is the PID (proportional-integral-derivative) controller. The PID controller essentially predicts future system behavior based on immediate past behavior of the system.

The proportional control variable is used to correct for any offset errors from the system characteristics. The integral control variable is used to correct errors that accumulate overtime. Finally, the derivative variable is used to correct for rapid changes in system behavior. The resulting PID controller is extremely robust and able to provide good control of the system.

Other type of controllers include, for example, adaptive controllers that are used to control systems that change over time. By anticipating changes in a system over time, the adaptive controller is able to predict the changed system performance, thereby resulting in finer or more accurate system control.

Another field of interest that has developed as a result of the systems engineering and industrial engineering fields is the field of signal transmission. For example, sensors in a factory monitor factory performance. The sensor transmits data back to a central computer for processing, analysis, and the like. The challenge in the signal transmission field is to transmit the least amount of data while still maintaining essentially the same quality of information needed to effectively monitor the factory performance. As a result, many different techniques have arisen that attempt to transmit less data. These techniques, generally called data compression techniques, attempt to compress the amount of data that must be transmitted to the processor.

Data compression techniques all center on new computer processes that permit the processor to interpolate or estimate the data that has been compressed and not transmitted. For example, one technique involves only the transmitting of data if, for example, a sensor detects a change in previous conditions beyond a predetermined threshold. In this scenario, the sensor will not transmit information that is redundant and that merely reconfirms existing recorded conditions of the system being sensed or monitored. Thus, data compression techniques center upon or emphasize the need to convey only significant information to monitor, control or analyze system performance in an effective manner.

Another technique that has also developed as a result of the systems engineering field is the field of systems simulation. In this field, a systems engineer models a physical system mathematically. The system engineer subsequently exercises or runs simulations on the system model to learn how the system might react under varying conditions or circumstances. The challenge in the systems simulation field is to accurately model a system in a manner which is not mathematically complex, or else the simulation will not be able to be efficiently executed by computer. Accordingly, many different types of algorithms have been developed that attempt to model system behavior in an efficient manner which are practical for execution by a computer.

Accordingly, the prior art attempts have generally focused on developing better models, better controls or more efficient ways to transmit data for monitoring system performance. However, these prior art attempts have generally not focused on better to ways to prepare system models for execution. These prior art attempts have also not considered or concentrated on more efficient ways of combining various different system characteristics to prepare the model for execution or implementation.

These prior art attempts have also not concentrated on more efficient methods of monitoring the progress of model execution based on general model characteristics. That is, the prior has not catered or customized display/monitor techniques that are particularly efficient for computer implementation. Further, the prior art techniques have not capitalized on the unique aspects of object oriented technology that are particularly well suited to provide these more efficient system models and execution of same.

We have determined, therefore, that it is desirable to design better ways to prepare system models for execution. We have also realized that it is desirable to design more efficient ways of combining various different system characteristics to prepare the model for execution or implementation.

We have also realized that more efficient methods of monitoring the progress of model execution based on general model characteristics are needed. In this connection, we have defined a graphic model as a combination of static and dynamic objects, animation of real-time variables, input controls (GISMOs-discussed below), and control actions. Static objects can consist of elements as simple as squares, or as sophisticated as AUTOCAD drawings or bitmaps. Input controls within a graphic model can be anything from numeric or text boxes, to buttons, sliders and menus. It is therefore desirable to design customized display/monitor techniques that are particularly efficient for computer implementation.

Further, we have determined that the unique aspects of object oriented techniques are particularly well suited to provide these more efficient system models and execution of same.

SUMMARY OF THE INVENTION

It is a feature and advantage of the present invention to design better to ways to prepare system models for execution.

It is another feature and advantage of the present invention to design more efficient ways of combining various different system characteristics to prepare the model for execution or implementation.

It is another feature and advantage of the present invention to provide more efficient methods of monitoring the progress of model execution based on general model characteristics is needed.

It is another feature and advantage of the present invention to design customized display/monitor techniques that are particularly efficient for computer implementation.

It is another feature and advantage of the present invention to utilize the unique aspects of object oriented technology that are particularly well suited to provide these more efficient system models and execution of same.

The present invention is based, in part, on the identification of the problem associated with the designing, building and implementation of system models.

The problem relates to the relatively slow ability to execute system models, resulting in a high reliance on computer processing power requiring much time to execute and display for analysis by a user.

We have further identified the problem associated with designing and implementing system models of not considering the model characteristics and integration of same when designing, building and execution of system models. We have also discovered that when the model characteristics are considered as part of the model design, build and execution, an enhanced model results which can be efficiently executed, displayed and analyzed by a user.

To achieve these and other features and advantages of the present invention, the computer implemented object oriented system is an object-oriented visualization environment ideally suited for use with supervisory control and process control systems. The computer implemented object oriented system enables the user to quickly create powerful, dynamic graphics capable of displaying real-time and historical information in a comprehensive picture. In addition, other user-defined information can be accessed from any source within the enterprise thanks to the use of a standard client/server architecture.

The following additional features are provided by the computer implemented object oriented system:

Powerful graphics editor rich in features including 64 user-definable colors, 8 blinking colors, object grouping, animation, standard geometric shapes, and scaleable fonts.

Preview dynamic behavior within the graphics editor to verify proper orientation.

Import capability allows the incorporation of external drawings, geographical information (GIS), and AUTOCAD diagrams into graphic models.

Object-oriented architecture speeds up the creation and simplifies the maintenance of all graphic models.

System-wide graphic registry ensures automatic updating and distribution of graphic models to any operator workstation.

Multiple windowing functionality with easy-to-use display controls, such as cascade, tile, close, close-all, pan, zoom and Frame Sets.

All windows and graphic models full scaleable using vector based graphics.

Smart graphical objects (SGOs) provide easy data sourcing definition, along with simplified re-use.

Standard action GISMOs and SGOs that assist in quick display development. Ease-of-access provided through custom palettes.

Enterprise-wide information access through standard client/server architecture (based on OSF/Distributed Computing Environment).

The computer implemented object oriented system provides beneficial access to enterprise-wide information through an easy to use, extensible visualization environment. This is accomplished through the integration of an advanced, object-oriented graphics system with an industry standard client/server architecture.

The creation of graphic models is performed through the computer implemented object oriented system graphics editor. A graphic model can consist of static and dynamic objects, animation of real-time variables, input controls (GISMOs-discussed below), and control actions. Static objects can consist of elements as simple as squares, or as sophisticated as AUTOCAD drawings or bitmaps. Input controls within a graphic model can be anything from numeric or text boxes, to buttons, sliders and menus.

Control actions are made possible through both pop-up control boxes and invisible control action areas, scripted to execute specific control sequences. Finally, the essence of dynamic behavior and animation is accomplished through the use of Smart Graphical Objects (SGOs). The SGO is the key to quick and simple dynamic object creation in a graphic model. The user need only define dynamic behavior, animation, and information characteristics once for a typical object. Thereafter, any SGO can be "instanced" (re-used) within a graphic model by defining the real tag name in place of the token variable name of the SGO.

Following the creation of a graphic model in the computer implemented object oriented system, it is readied for use through a process known as "registration". The computer implemented object oriented system includes a system-wide graphics management system known as the Graphic Model Registry. This registry manages the propagation of all models across all display platforms, guaranteeing that the most current graphic model is available for display whenever requested. It also provides validation of a graphic model during the registration phase, helping to locate data sourcing errors prior to distribution.

To view a graphic model, the computer implemented object oriented system run-time (VRT) is used at the desired workstation. The VRT is a complete display environment with a convenient navigator window for environment control. Through this starting point, the user can launch any graphic from the directory of available graphic models, or re-create entire screen environments using frame sets. The VRT supports multiple windows, with each window an independent client providing pop-ups, controls, window operations (e.g. Pan and Zoom), and printing. In addition, security is also provided within the VRT, so that an unauthorized user may not activate sensitive controls.

According to one embodiment of the invention, provided is a computer architecture for executing a simulation model which describes characteristics of a physical system. The computer architecture includes an editor processor that prompts a user to define a graphical object (GO) representing static properties of the physical system, and that prompts the user to define dynamic variables of the physical system. The computer architecture also includes a compiler for binding the dynamic variables of the physical system to a physical data source. The physical data source provides dynamic properties of the physical system over time as values for the dynamic variables. The computer architecture also includes a run time processor that executes the simulation model and displays the graphical object with the dynamic properties of the physical system.

According to another embodiment of the invention, a computer implemented method for linking dynamic variables including tag and attribute variables from a dataserver to a graphical object is provided. The tag variable represents a pointer and the attribute variable represents a field associated with the pointer. The tag and attribute variables are utilized by the computer implemented method for retrieving dynamic properties from the data source as the values for the dynamic variables. The simulation model describes characteristics of a physical system. The method includes the step of defining a graphical object (GO) representing static properties of the physical system and the dynamic variables of the physical system. The method also includes the step of binding the dynamic variables of the physical system to the data server having access to a data source, associating the dynamic variables including the tag and attribute variables and an update rate to the data source, and retrieving the dynamic properties from the data source responsive to the update rate and attribute and tag variables.

These together with other objects and advantages which will be subsequently apparent, reside in the details of construction and operation as more fully herein described and claimed, with reference being had to the accompanying drawings forming a part hereof wherein like numerals refer to like elements throughout.

BRIEF DESCRIPTION OF THE DRAWINGS

FIG. 21 is a diagram illustrating a rename variable function for a smart graphical object in the editor system for the computer implemented object oriented visualization system;

BEST MODE FOR CARRYING OUT THE INVENTION

Figure 1:
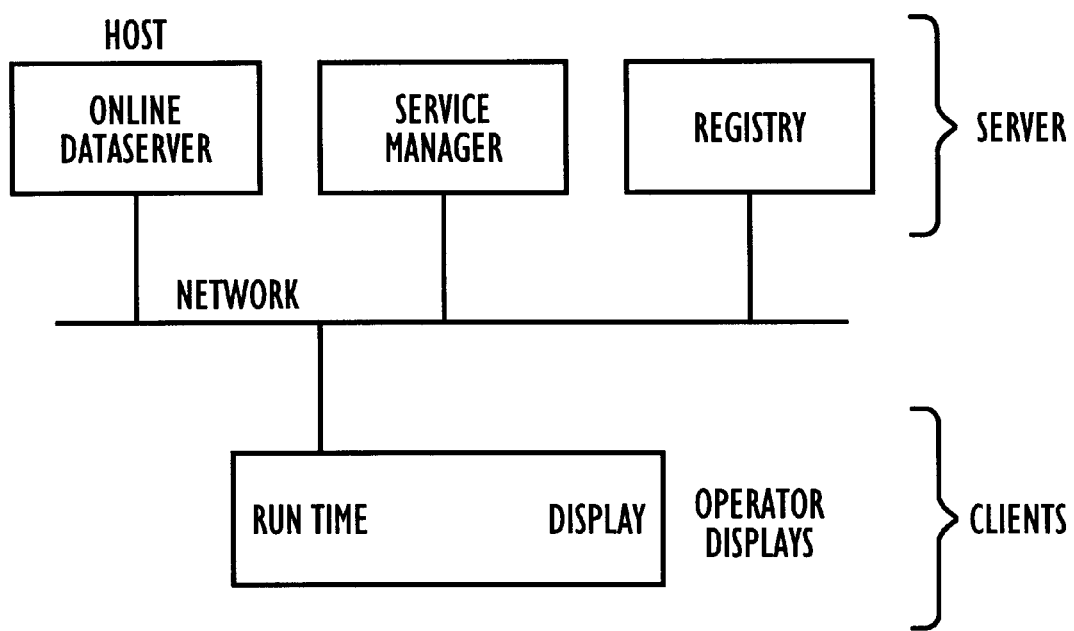
FIG. 1 is a diagram illustrating a computer system architecture for the computer implemented object oriented visualization system.

The computer implemented object oriented system is an object-oriented visualization environment ideally suited for use with supervisory control, process control simulation and training systems. The computer implemented object oriented system enables the user to quickly create powerful, dynamic graphics capable of displaying real-time and historical information in a comprehensive picture. In addition, other user-defined information can be accessed from any source within the enterprise thanks to the use of a standard client/server architecture.

The following features are provided by the computer implemented object oriented system:

Powerful graphics editor rich in features including 64 user-definable colors, 8 blinking colors, object grouping, animation, standard geometric shapes, and scaleable fonts.

Preview dynamic behavior within the graphics editor to verify proper orientation.

Import capability allows the incorporation of external drawings, geographical information (GIS), and AUTOCAD diagrams into graphic models.

Object-oriented architecture speeds up the creation and simplifies the maintenance of all graphic models.

System-wide graphic registry ensures automatic updating and distribution of graphic models to any operator workstation.

Multiple windowing functionality with ease-to-use display controls, such as cascade, tile, close, close-all, pan, zoom and Frame Sets.

All windows and graphic models full scaleable using vector based graphics.

Smart graphical objects (SGOs) provide easy data sourcing definition, along with simplified re-use.

Standard action GISMOs and SGOs that assist in quick display development. Ease-of-access provided through custom palettes.

Enterprise-wide information access through standard client/server architecture (based on OSF/Distributed Computing Environment).

The computer implemented object oriented system provides beneficial access to enterprise-wide information through an easy to use, extensible visualization environment. This is accomplished through the integration of an advanced, object-oriented graphics system with an industry standard client/server architecture.

The creation of graphic models is performed through the computer implemented object oriented system graphics editor. A graphic model can consist of static and dynamic objects, animation of real-time variables, input controls (GISMOs-discussed below), and control actions. Static objects can consist of elements as simple as squares, or as sophisticated as AUTOCAD drawings or bitmaps. Input controls within a graphic model can be anything from numeric or text boxes, to buttons, sliders and menus.

Control actions are made possible through both pop-up control boxes and invisible control action areas, scripted to execute specific control sequences. Finally, the essence of dynamic behavior and animation is accomplished through the use of Smart Graphical Objects (SGOs). The SGO is the key to quick and simple dynamic object creation in a graphic model. The user need only define dynamic behavior, animation, and information characteristics once for a typical object. Thereafter, any SGO can be "instanced" (re-used) within a graphic model by defining the real tag name in place of the token variable name of the SGO.

Following the creation of a graphic model in the computer implemented object oriented system, it is readied for use through a process known as "registration". The computer implemented object oriented system includes a system-wide graphics management system known as the Graphic Model Registry. This registry manages the propagation of all models across all display platforms, guaranteeing that the most current graphic model is available for display whenever requested. It also provides validation of a graphic model during the registration phase, helping to locate data sourcing errors prior to distribution.

To view a graphic model, the computer implemented object oriented system run-time (VRT) is used at the desired workstation. The VRT is a complete display environment with a convenient navigator window for environment control. Through this starting point, the user can launch any graphic from the directory of available graphic models, or re-create entire screen environments using frame sets. The VRT supports multiple windows, with each window an independent client providing pop-ups, controls, window operations (e.g. Pan and Zoom), and printing. In addition, security is also provided within the VRT, so that an unauthorized user may not activate sensitive controls.

The computer implemented object oriented system is a complete data visualization environment, providing not just one or two pieces of the picture, but providing ease-of-use from beginning to end—from data access through the presentation of the data at the user's personal computer or workstation.

Computer Implemented Object Oriented System Graphics Systems Overview

The computer implemented object oriented system graphics system permits the user to create and run displays showing real time process data. This section introduces the major design concepts behind the computer implemented object oriented system graphics system.

The computer implemented object oriented system graphics are based on, for example, the standard SL-GMS graphic library, a multi-platform toolkit for creation of dynamic graphic displays. SL-GMS is manufactured and distributed by SL Corporation. Based on client server technology from the standard Open Systems Foundation, the computer implemented object oriented system graphics display processes data from a variety of sources.

The major component of the computer implemented object oriented system are as follows:

SL-GMS (or GMS): Any standard Graphic Modeling System, for example, the modeling system SL-GMS from SL Corporation. This software provides the underlying mechanism for editing and displaying dynamic graphics in the computer implemented object oriented system Graphics system.

Computer Implemented Object Oriented System Editor (VED): The computer implemented object oriented system editor is a tool for creating custom graphics. These graphic models are dynamic displays driven from the process database. almost every object attribute may be controlled, including size, position, fill color, edge color, rotation, visibility, and the like.

Computer Implemented Object Oriented System Model Compiler (VMC): A tool for validating graphical models created by the editor. The compiler optimizes each graphic model and registers the model in the Registry database. It also verifies each dynamic link to the process database.

Computer Implemented Object Oriented System Run Time (VRT): This application displays dynamic graphical models to the operator. Models must be created by the computer implemented object oriented system editor and processed by the compiler before they can be displayed.

Distributed Computing Environment (DCE): A product from Open Systems Foundation that provides the underlying technology used by the computer implemented object oriented system product. It is a standard toolkit used to build client server applications that operate across multiple platforms using multiple communications protocols. DCE includes several standard products such as Distributed Time Services, Global Directory Services, Kerberos Security Services, and Remote Procedure Calls. Remote Procedures Calls (RPCs) are the main or essential portion of DCE used by the computer implemented object oriented system.

DEC TCP/IP Services (UCX): UCX is a communications toolkit which can be used with the computer implemented object oriented system. It provides Transport Control Protocol/Internet Protocol (TCP/IP) on Digital (DEC) Platforms. UCX runs concurrently with DECnet. Use of UCX is optional and not a necessary ingredient of the computer implemented object oriented system.

Dataservers: A standard DCE-based server (or other standard data server) that supplies process data to the computer implemented object oriented system. A standard dataserver toolkit is available for creating custom dataservers that access data from other sources.

Registry: The Registry maintains a directory of graphic models for display by the VRT. It also performs copying and synchronization of models for all nodes running VRT. The Registry uses DCE technology for client server operation across the network.

Service Manager: The service manager maintains a directory of DCE based servers associated with the computer implemented object oriented system such as the dataservers and the Registry. Client applications such as the VRT and the compiler use the Service Manager to locate network based servers.

SYSTEM ARCHITECTURE

The following discusses the modules which make up the computer implemented object oriented system graphics system. The computer implemented object oriented system graphics use client server technology to distribute applications across a communications network. Servers such as the Registry and dataserver provide data of various types to client applications such as the VRT. Clients and servers may run on the same node or on separate nodes.

The client server architecture is base upon the Remote Procedure Calls portion of the Distributed Computing Environment. Remote Procedure Calls, or RPCs, allow processes to execute on other nodes in the network by handling the communication and data translation functions between the client and server.

Each computer implemented object oriented system Graphics System utilizes three servers and one or more clients. The servers include:

Registry—Provides a directory of model names which can be displayed by the operator.

Dataserver—Provides process data for each model displayed to the operator.

Service Manager—Provides a directory of services to client applications. Typically this includes the Registry and dataservers described above.

FIG. 1 shows the computer implemented object oriented system architecture. The computer implemented object oriented system run time client software and the display software work together to provide operator displays.

Model Creation—The Computer Implemented Object Oriented System Editor

Figure 2:
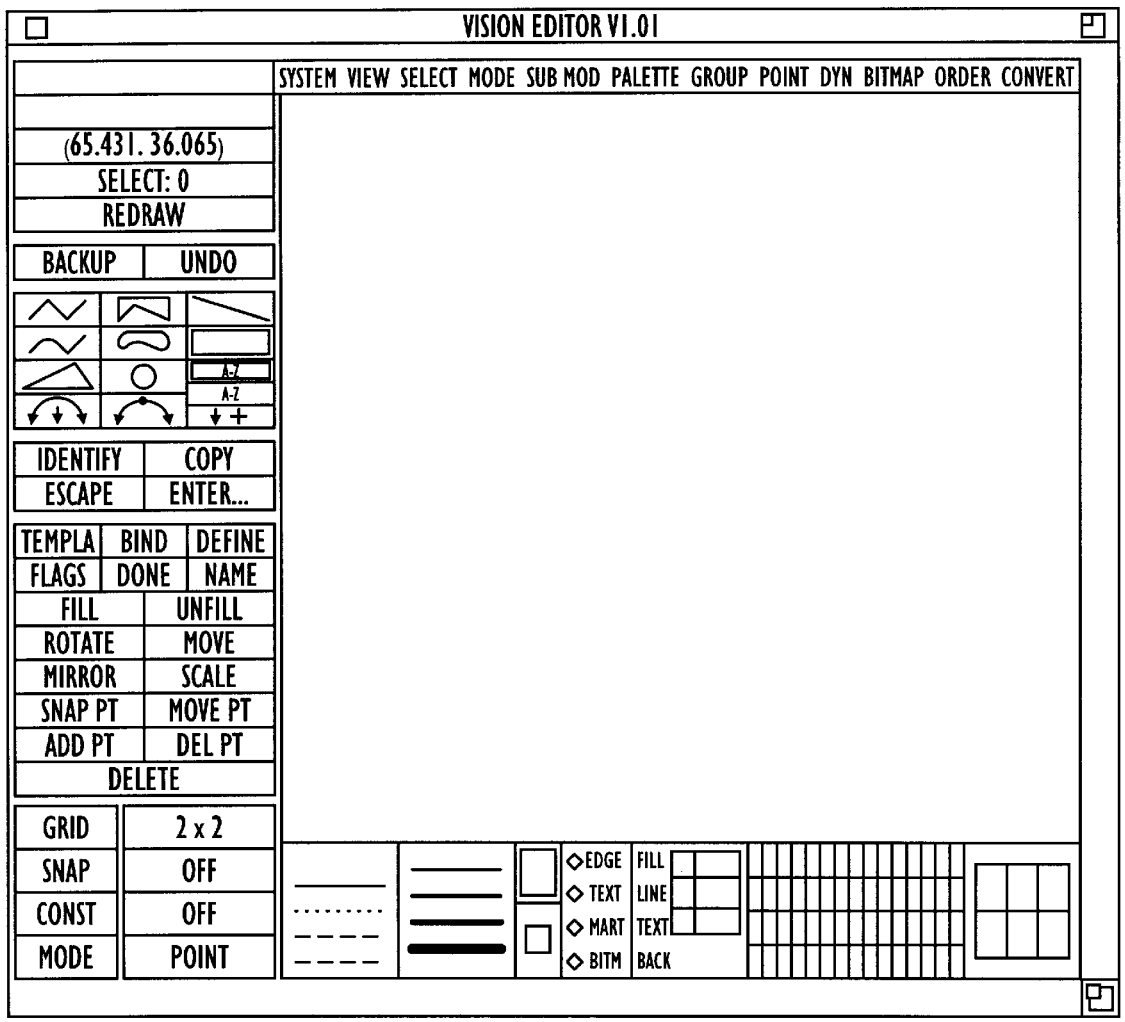
FIG. 2 is a diagram illustrating an editor processor for the computer implemented object oriented visualization system.

The computer implemented object oriented system Graphics Editor is used to create dynamic graphical displays. The main editing window is shown in FIG. 2 and editor functions are discussed in detail in a later section.

The computer implemented object oriented system editor is a modified version of the SL-GMS Draw2x editor supplied by SL Corp.

Figure 3:
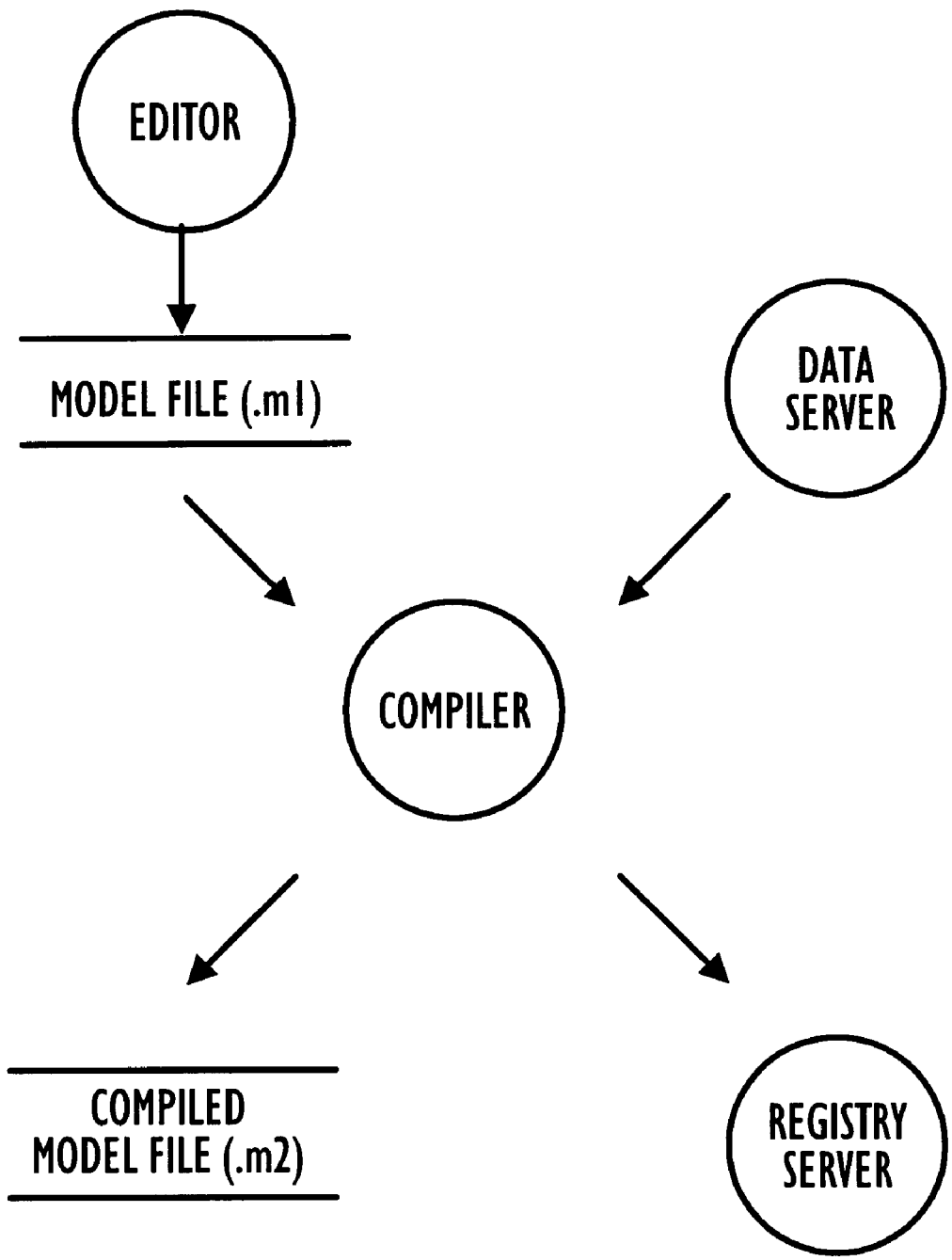
FIG. 3 is a diagram illustrating a compiler processor system for the computer implemented object oriented visualization system.

Model Compilation—The Computer Implemented Object Oriented System Model Compiler The computer implemented object oriented system model compiler, illustrated in FIG. 3, validates the data source references found in a model. The output of the compiler is an optimized model file that can be quickly loaded by the VRT Runtime software for optimum display callup times.

Model files created by the computer implemented object oriented system editor are read by the computer implemented object oriented system model compiler. The compiler validates references to the dataserver and creates a new model file optimized for display by the operator. Upon successful compilation, the compiler enters the model in the Registry which makes it available for operator display.

Model Registry—The Computer Implemented Object Oriented System Model Registry

Figure 4:
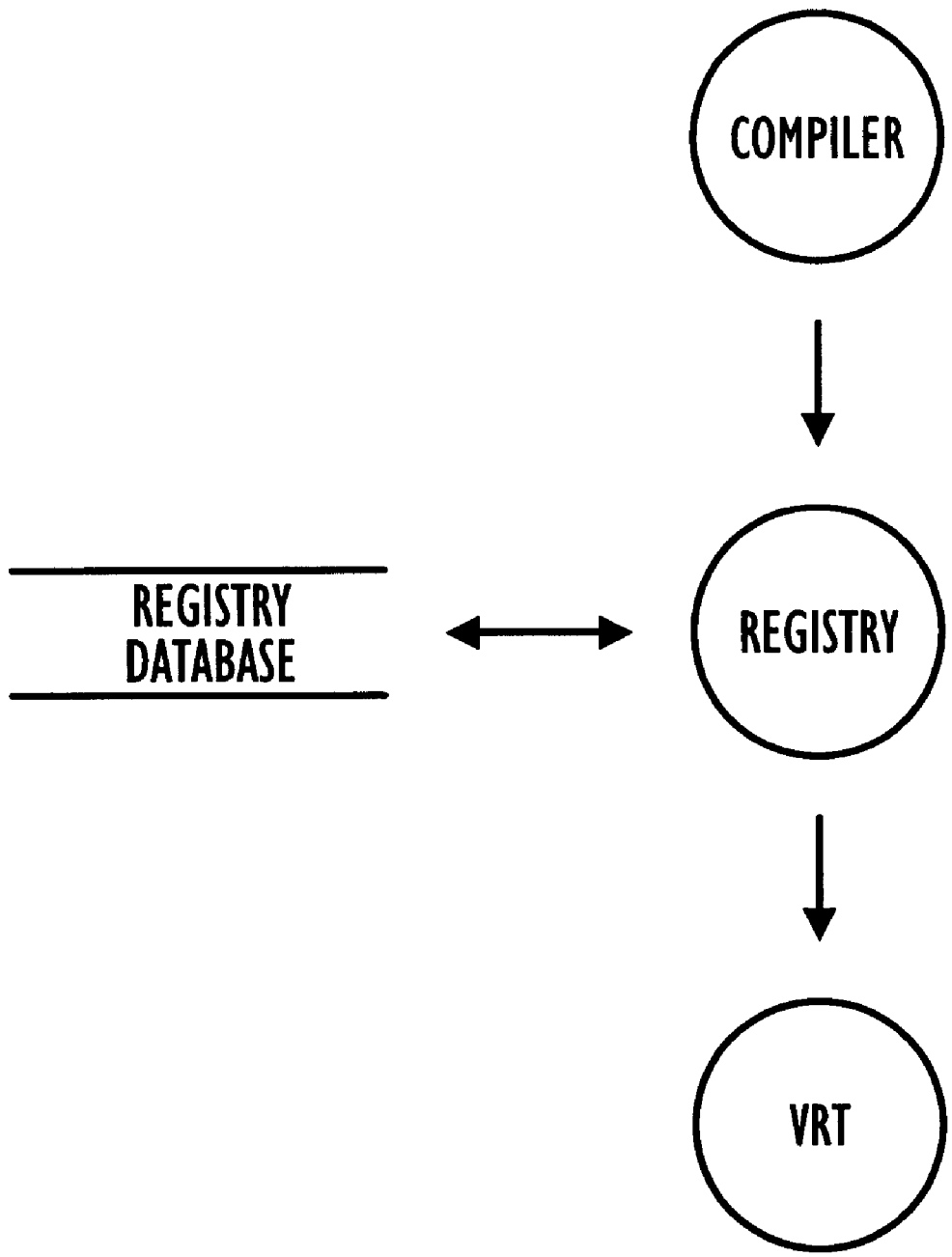
FIG. 4 is a diagram illustrating a registry processor system for the computer implemented object oriented visualization system.

The computer implemented object oriented system model registry, illustrated in FIG. 4, maintains a system wide database of compiled models. The registry also provides automatic updating of all registry nodes in the system so that models are automatically copied across the network and updated when old versions of the model change.

After successfully compiling a model, the compiler registers the model information in the Registry database. The registry makes this information available to the VRT for operator display. Each node in the system used to display computer implemented object oriented system graphics has its own Registry server.

Run-Time—The Computer Implemented Object Oriented System Dataserver

Figure 5:
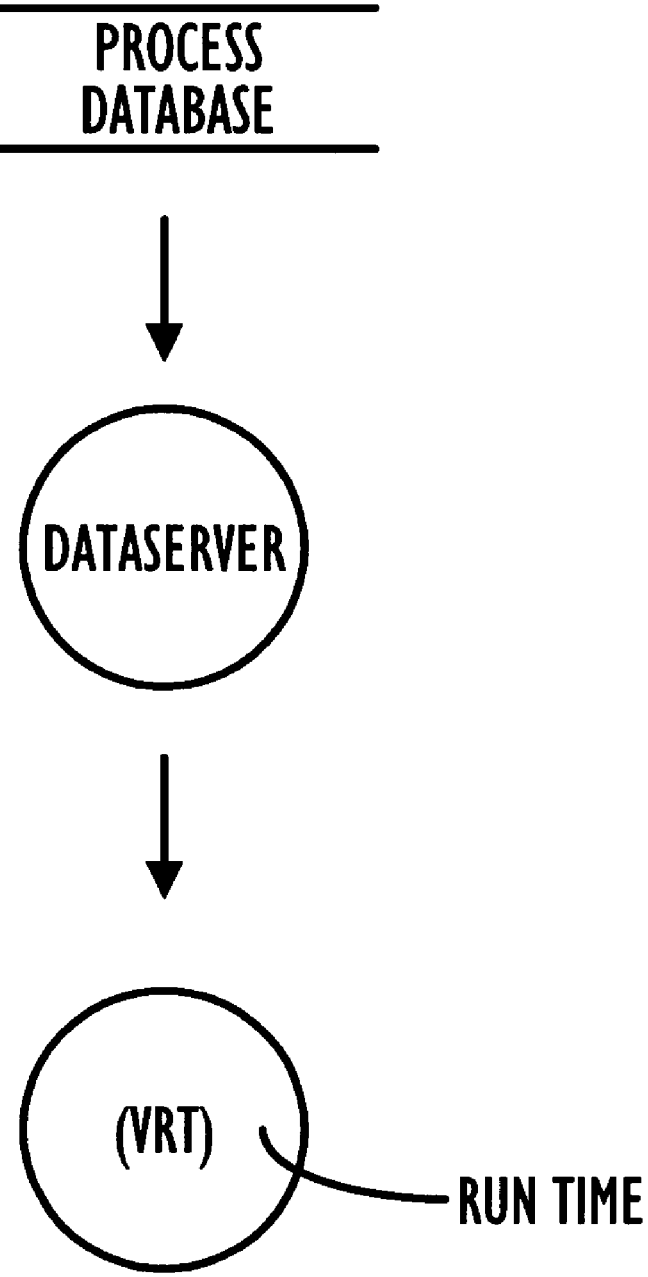
FIG. 5 is a diagram illustrating a data server processor system for the computer implemented object oriented visualization system.

The computer implemented object oriented system dataserver, illustrated in FIG. 5, provides process data needed for displaying dynamic graphic displays. Several types of dataservers are available depending on individual applications.

Every computer implemented object oriented system requires at least one dataserver to transfer data between the process and dynamic graphic displays.

Figure 6:
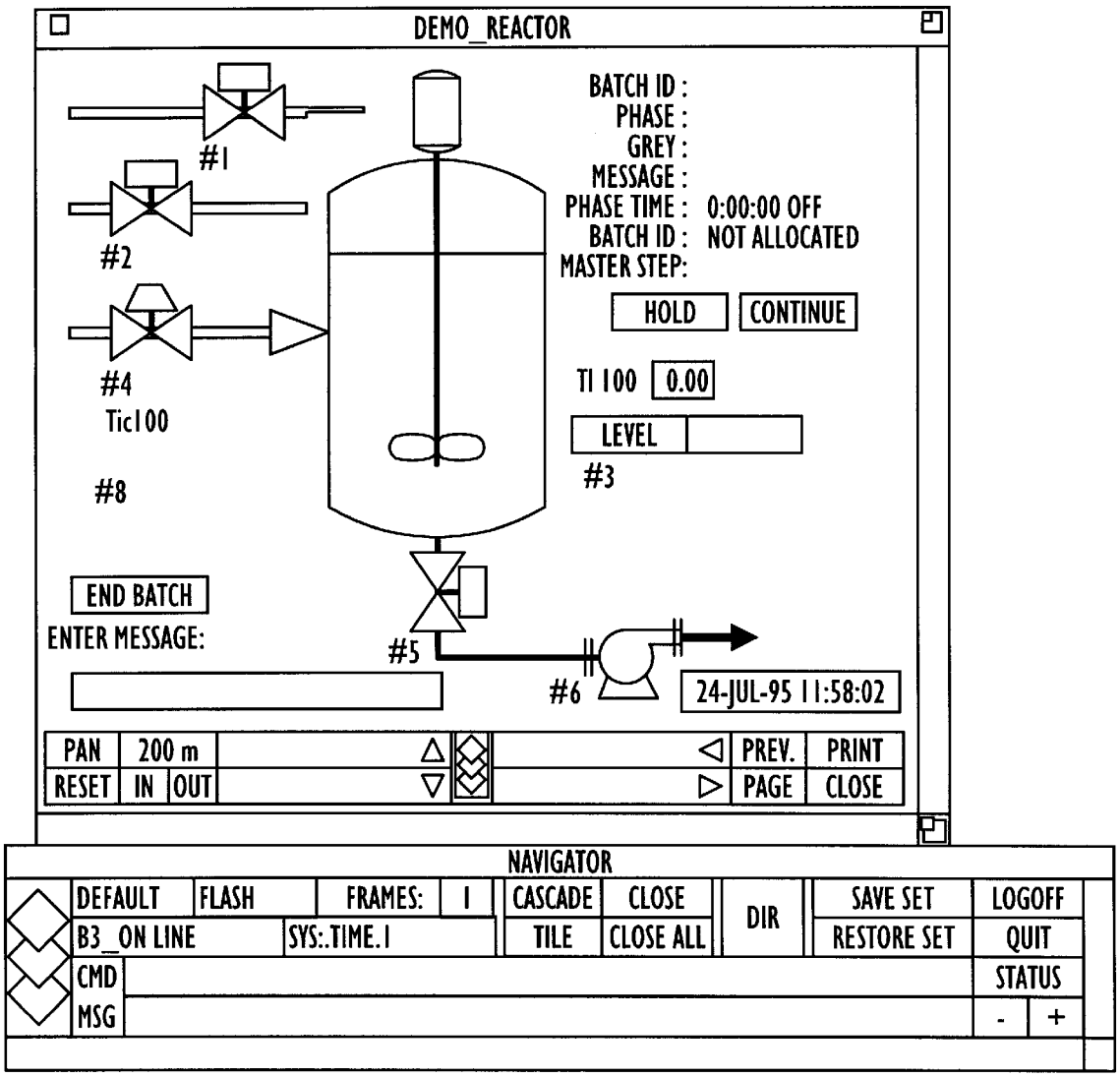
FIG. 6 is a diagram illustrating a run time model processor system for the computer implemented object oriented visualization system.

Process Dataserver—The Computer Implemented Object Oriented System Runtime Module The computer implemented object oriented system runtime display module, also known as VRT and illustrated in FIG. 6, is the software that displays dynamic models to the operator.

How to Create and Display a Model

Figure 7A:
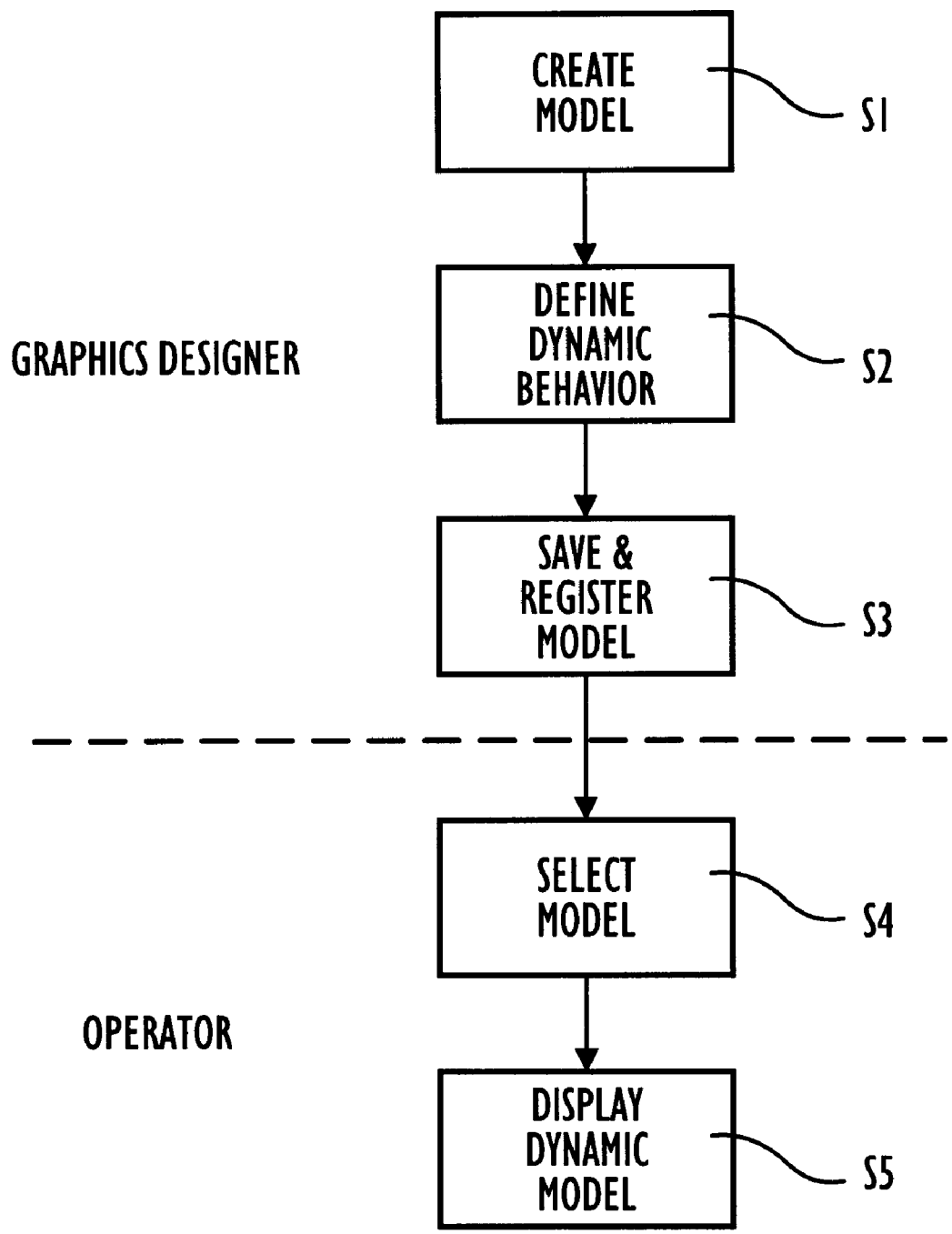
FIG. 7A is a diagram illustrating a general model creation system for the computer implemented object oriented visualization system.

Graphical displays in the computer implemented object oriented system are known as models. The following steps summarize the model creation process in FIG. 7A:

Step S1. The graphics designer creates a graphical model using the computer implemented object oriented system Editor.

Step S2. The designer assigns dynamic behavior to objects contained in the model and links the objects to the process database.

Step S3. The designer registers the model with the computer implemented object oriented system graphics system. This process validates process database references and updates directory information on each node in the system.

Step S4. The operator selects a model for display.

Step S5. The system links the model to the process database and displays the dynamic model to the operator.

Figure 7B:
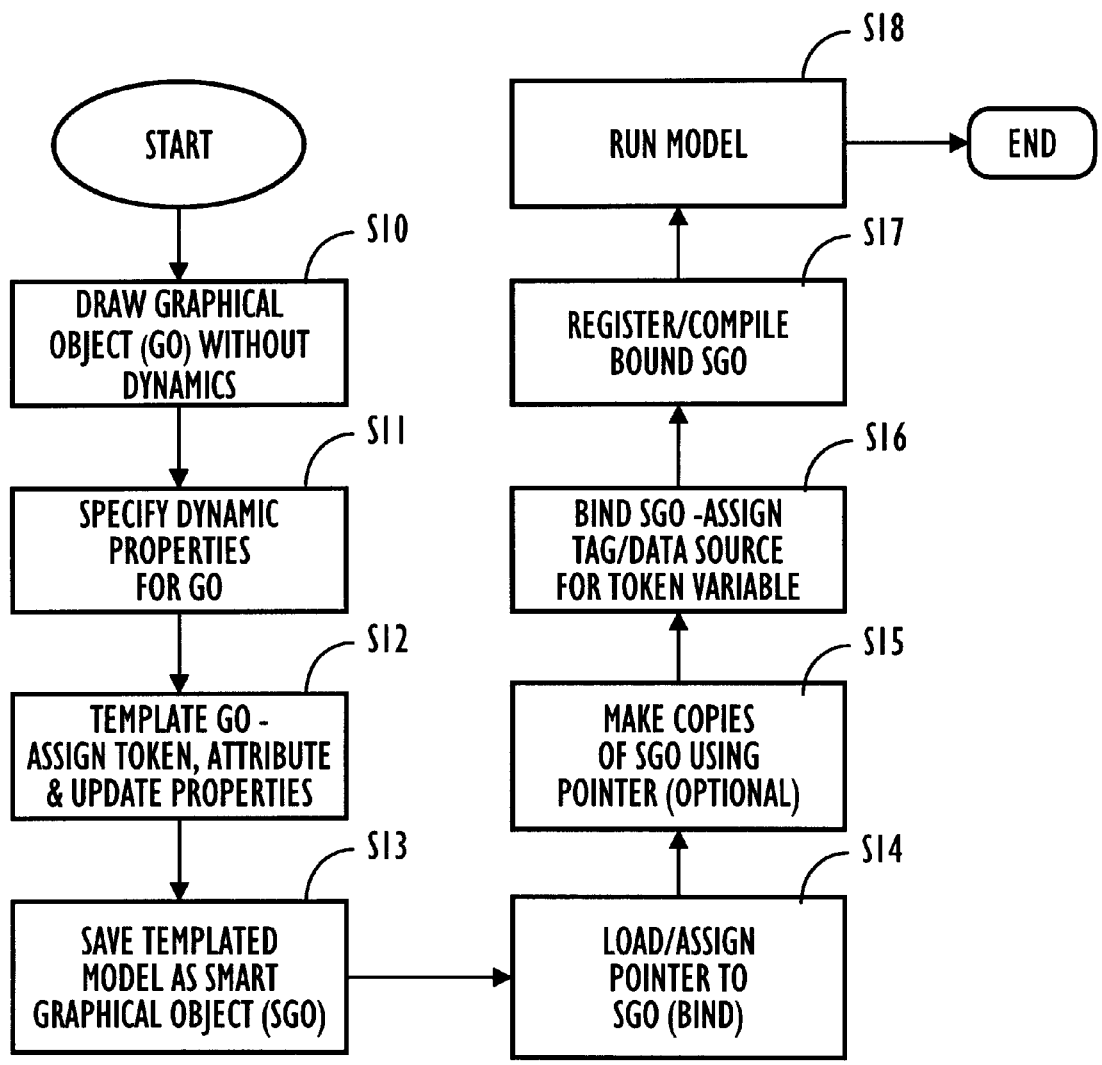
FIG. 7B is a diagram illustrating a detailed model creation system for the computer implemented object oriented visualization system.

FIG. 7B is a detailed flow chart illustrating the processes of the computer implemented object oriented system. In FIG. 7B, the computer implemented object oriented system prompts the user to draw a graphical object (GO) in Step S10. The GO is provided by the user without specifying the accompanying dynamics associated therewith. Next, the system prompts the user to provide the dynamic behaviors or properties (for example, a scripting language driven by variables and values) associated with the GO in Step S11.

The system then templates the GO in Step S12. The templating process essentially assigns token, attributes and update properties that drive the dynamic properties associated with the GO. The system then saves the templated model as a Smart Graphical Object (SGO) in Step S13. The system then loads or assigns a pointer to the SGO in Step S14. The assignment of a pointer to the SGO permits the SGO to be copied multiple times by addressing the SGO via the pointer.

The system may then optionally copy the SGO using the pointer in Step S15. The SGO is then bound to the appropriate data source by defining an appropriate tag and associating it with the token in Step S16. By filling in or assigning the data source to the token variable, a generic method of associating the data source to the token results. The SGO model is then registered and stored in memory and compiled in Step S17. When the SGO is compiled successfully, the SGO model is validated, optimized with respect to structure and format, and stripped of any unnecessary processing steps. Only the dynamic properties of the SGO model are generally compiled to obtain the dynamic properties to prepare the SGO for execution, since the static properties of the SGO, i.e., the GO properties, remain generally unchanged during model execution. The model is then executed or run in Step S18.

Model Components

A computer implemented object oriented system model is a collection of objects which graphically represent real time process data. The computer implemented object oriented system models consist of:

Primitive objects—lines, circles, rectangles, etc.

Other models—Submodels that are included in another model either by making a copy of the original (Local submodel) or by referencing the original model (External submodel).

SGOs—Smart Graphical Objects that contain one or more primitive objects automatically linked to the process database.

GISMOS—Graphical Interactive Screen Management Objects that respond to user input events such as a mouse click or a key press.

Graph objects—Submodels that display XY or trend plots.

Models created with the computer implemented object oriented system Editor are stored as M1 files. The M1 file is a binary file that is hardware and operating system specific. For many applications, the libraries provide the starting point for creating custom process graphics. To use a library object, the designer selects the object from a palette and drags it with the mouse to the main editing window.

Next, the object is associated with one or more tags from the process database so that its pre-defined behavior can be activated at run time. Library objects can be used as is, or modified to suit individual needs. Using the scripting language and tools found in the computer implemented object oriented system Editor, the graphics designer can create many variations of the original objects.

When displaying models to the operator, the VRT process links the dynamic objects found in the model to the process database using one or more dataservers. Typically, data requests to the dataserver are specified using a tag and attribute where tag represents a point in the process database and attribute represents a field associated with the point type. For example, if tag represents the EPN F1C01 and attribute represents the input value AI_INVL, the resulting data source specification is F1C01.AI_INVL. Variations on this syntax exist depending on the server implementation.

Submodels

A submodel is a model used in another model. Submodels are classified as either local or external depending on how the submodel is referenced by the parent model. Any model can be a submodel. Submodels are also known as model instances. Model instances retain the dynamic properties of the original model but may be duplicated, scaled and placed anywhere in a new model. To differentiate a model instance from the original, the variables defined by the object's dynamic properties must be renamed to provide unique dynamic behavior.

Figure 8:
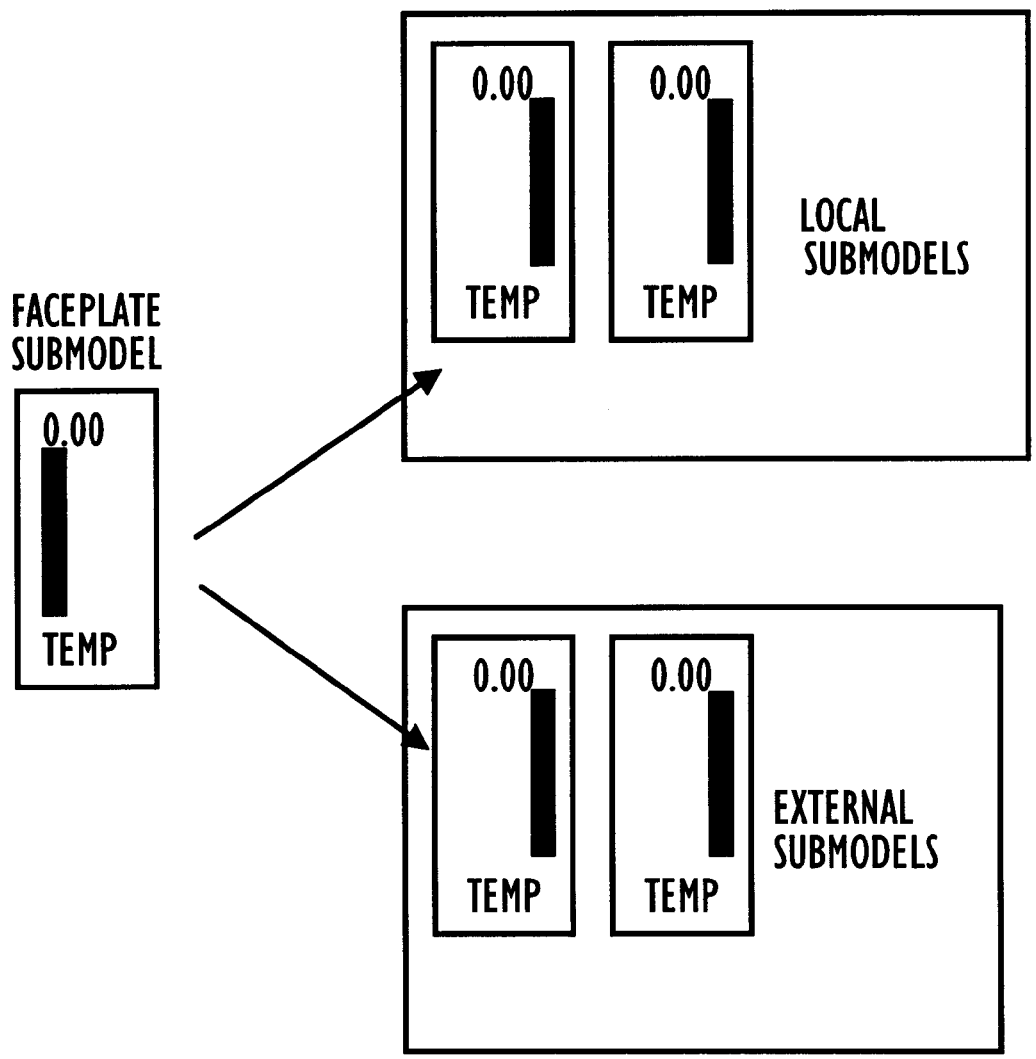
FIG. 8 is a diagram illustrating a top level model processor system for the computer implemented object oriented visualization system.

When a local submodel is created, it becomes part of the new model and loses the separate identity it had before incorporation. If the original submodel is changed, no changes to the parent model occur. When an external submodel is incorporated in a parent model, the submodel is referenced and not copied by the parent model. As a result, all top level models that refer to the submodel are automatically updated when the submodel changes. This feature promotes consistency in model design and encourages reuse of submodels. FIG. 8 shows two top level models that contain local and external instances of a faceplate submodel. Both models have the identical appearance.

Figure 9:
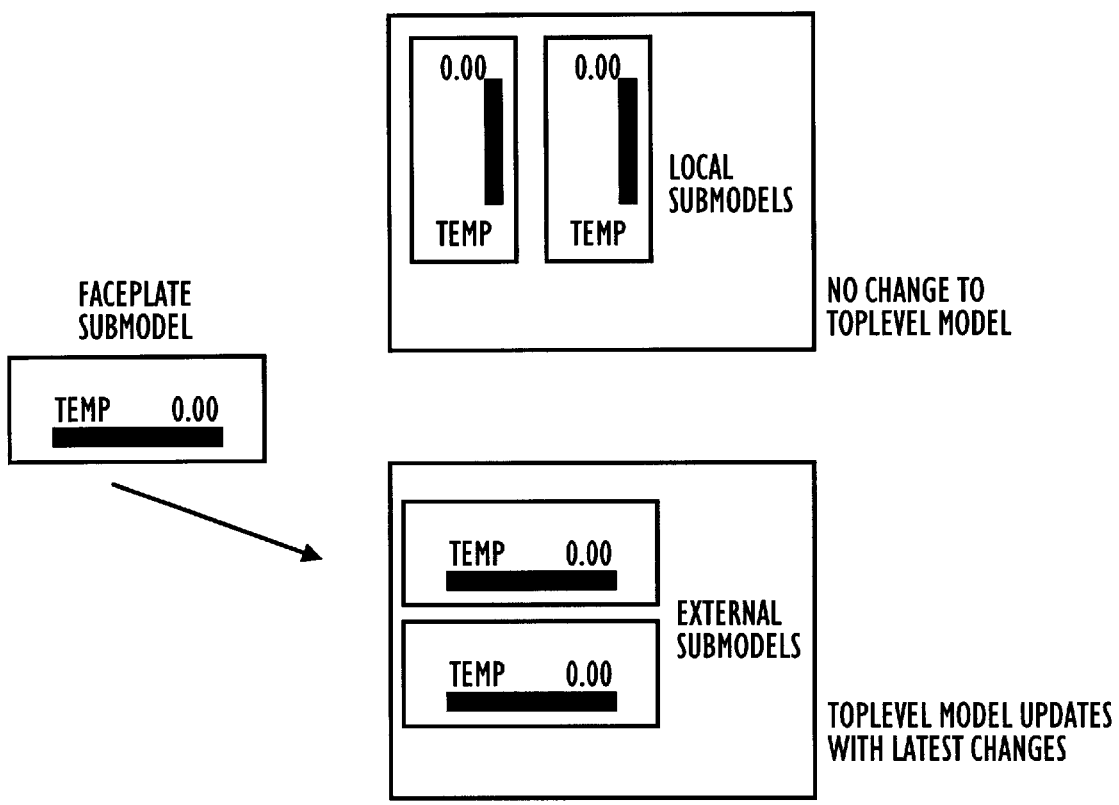
FIG. 9 is a diagram illustrating a revised top level model processor system for the computer implemented object oriented visualization system.

When the original faceplate submodel is changed, all top level models which reference this external submodel change to reflect the new version of the faceplate. This is illustrated in FIG. 9. Note that the local submodel has not changed, but the external submodel updates to show the new faceplate model.

In the computer implemented object oriented system graphics system, models must be compiled and registered before they can be displayed to the operator. This compilation process converts external submodels to local submodels and allows the top level model and all its submodels to be stored as a single file. As a result, changes to external submodels do not appear in the top level model unless they are recompiled.

GISMOS

GISMOS, or Graphical Interactive Screen Management Objects, produce an action based on an input event such as a mouse click or keyboard event. GISMOS have all the attributes of a typical GMS object with the additional ability to produce actions based on user input. A number of GISMOS have been provided in the computer implemented object oriented system library and many others are available in the standard GMS library.

There are several styles of the computer implemented object oriented system GISMOS which perform similar functions but differ in appearance.

P3 buttons have a 3 dimensional look and may be labeled with a text label to indicate their function.

AB boxes, or Action Boxes, are rectangular objects that may be placed in a model and hidden from the operator until needed. These boxes remain transparent until the diamond button in the VRT frame display is pressed indicating the position of all AB boxes. Action Boxes may be placed over other objects without changing their appearance.

M0 Buttons are rectangular buttons that may be placed around other objects. When the user clicks on the button, the object appears to move in and out like a standard push-button.

TXT GISMOS are objects that accept text input. The user must click on the object to select it before entering text. Text entry must be followed by the return key. The input behavior associated with a GISMO is specified using a DynProp applied at the top level of the GISMO model. When the user clicks on the GISMO, one or more callback functions are executed to obtain the desired behavior. These callbacks execute code located, for example, in the GMS library.

For complex behavior, it is possible to associate a GISMO with user written callback functions that must be linked in the VRT software. Refer to the *SL-GMS Reference Guide* for a detailed discussion of GISMOS and GISMO callback functions.

How to Define Dynamic Object Behavior

Objects which exhibit dynamic behavior in response to a change in the process do so according to a dynamic script or DynProp. Users have the option of creating their own objects and DynProps or using existing library objects to create process graphics. Library objects can also be modified to suit individual applications.

The GMS scripting language specifies the dynamic properties, or DynProps, of each object in a model. DynProps provide control over many object attributes such as edge color, fill color, XY position, rotation, etc. Variables referenced by DynProps are knows as GMS variables. DynProps are created using the computer implemented object oriented system editor functions Edit Dyn or Enter Dyn which are available in the Dyn Menu.

A Dynprop consists of an action and an action expression. For instance, the following DynProps sets the fill color of an object:

fcolor 1 (Color value 1 refers to the color number in editor color palette).

To make the fill color dynamic, we assign a GMS variable as the action expression and make it the target of the fcolor command. In the following example, the variable called myvar is used as the argument for the fcolor command:

fcolor tank_color

At runtime, the VRT software determines the value of the GMS variable "tank_color" and updates the fill color of the target object. Values for GMS variables may be assigned one of two methods:

1. The "Rename Vars" function in the computer implemented object oriented system editor can be used to permanently assign a value to a GMS variable. Once defined in this manner, the object behavior will not change at run time. The Rename Vars function is only available for variables used by a submodel.
2. The Define or Template/Bind functions associate a GMS variable with a process variable so that objects change appearance in response to changes in the process.

Figure 10:
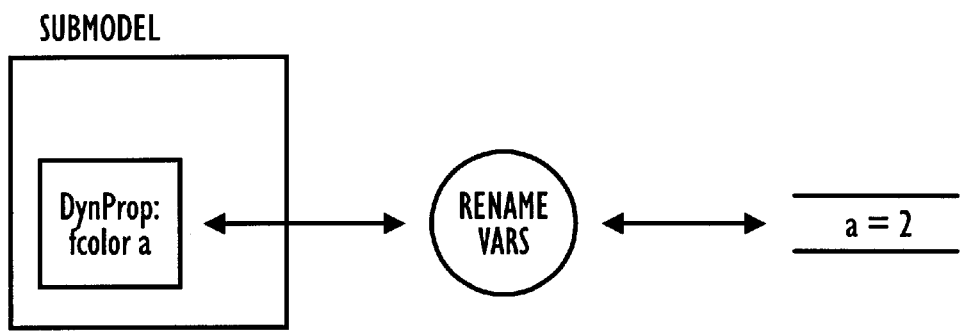
FIG. 10 is a diagram illustrating an absolute value dynamic script object for the computer implemented object oriented visualization system.

The following examples illustrate these concepts. Using the computer implemented object oriented system editor, the designer creates a model containing one submodel. The submodel, as illustrated in FIG. 10, contains one object with the following DynProp:

* fcolor a

This Dynprop indicates that the fill color of this object depends on the GMS variable "a". The * indicates that this expression be evaluated whenever variable "a" changes value.

Figure 11:
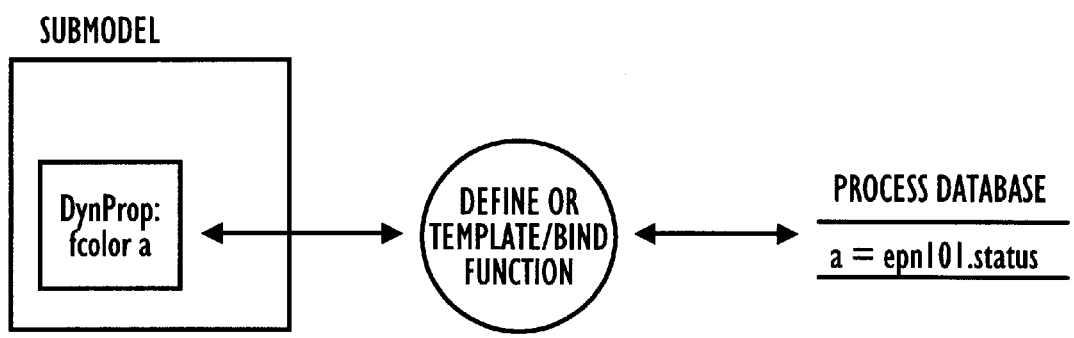
FIG. 11 is a diagram illustrating a dynamic data sourced value dynamic script object for the computer implemented object oriented visualization system.

Instead of assigning a fixed value to the variable "a", suppose we assign the fill color of the object based on the value of a status field in the process database. As illustrated in FIG. 11, using the Define or Template/Bind functions, the GMS variable "a" is linked to the process database tag "epn101" and attribute "status". When the value of epn101.status changes, the object's dynamic script updates the fill color of the object based on the value of the process variable. The Dataserver supplies process values to the model when displayed to the operator by the VRT process.

There are two methods of linking GMS variables used in the DynProp to the process database. The first method uses the Define function to directly link a script variable to a point in the process database. This method is suitable for linking simple objects to the database. Each script variable is assigned a process tag and attribute along with a server name and update rate.

The second method of linking dynamic properties to the process database uses the Template and Bind functions to create a Smart Graphical Object, or SGO. SGOs are useful for creating complex objects that reference multiple fields of one or more tags in the process database. They are described in detail in the following section.

Smart Graphical Objects

A Smart Graphical Object, or SGO, is a dynamic object whose variables have been linked to the process database independently of the process database tag. This provides a method of grouping variables that share one or more tags. Once an SGO has been created, only the tag(s) and servers need be specified for the system to automatically link GMS variables to the process.

Process data is referenced from a computer implemented object oriented system graphic using a tag and attribute where tag represents a point in the process database and attribute represents a field for the given point. For example, if tag represents the EPN FIC01 and attribute represents the input value field AI_INVL, the two specifications are appended to produce the final specification FIC01.AI_INVL. The period delineates the tag and attribute fields to the server and is inserted automatically during model compilation. (The period used to separate tag and attribute to the server is server dependent.) Tag and attribute fields may be further subdivided depending on the type of information requested.

Figure 12:
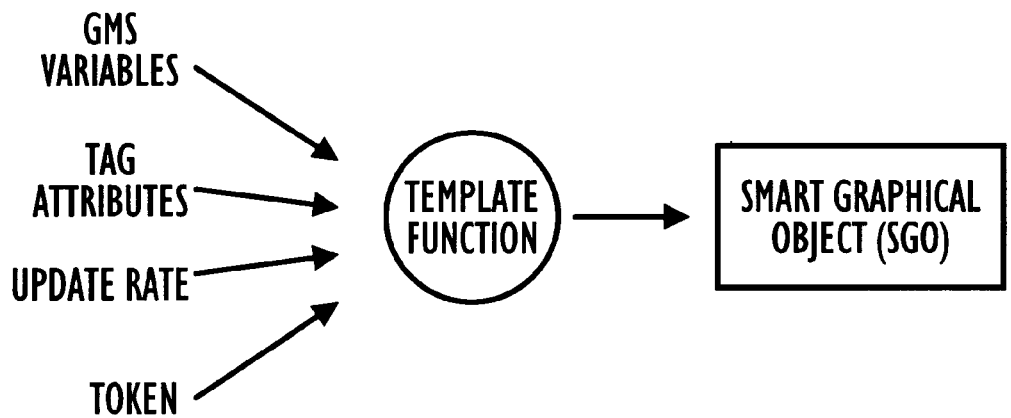
FIG. 12 is a diagram illustrating a templating function for the computer implemented object oriented visualization system.
Figure 13:
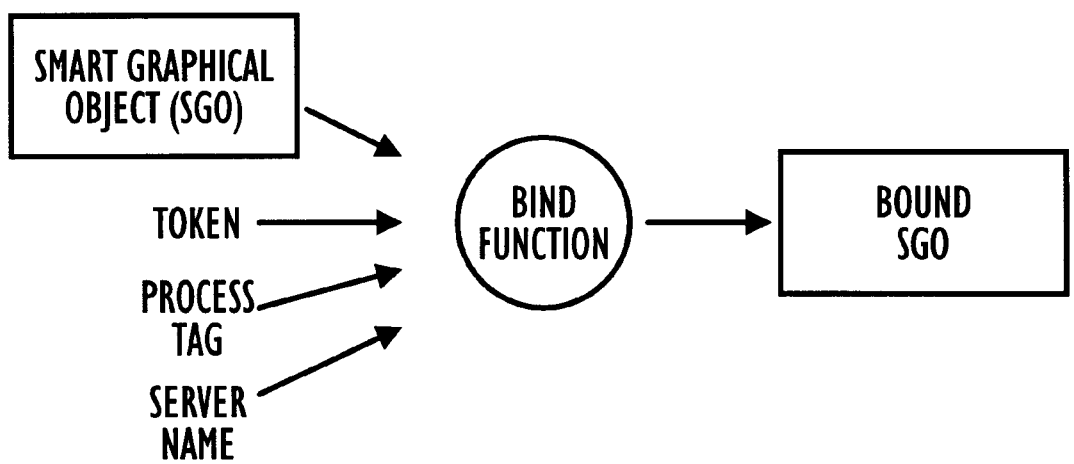
FIG. 13 is a diagram illustrating a binding function for the computer implemented object oriented visualization system.

The Smart Graphical Object provides a method of linking the tag and attribute specification from the dataserver to a graphical object in a process known as Templating and Binding. The following steps, illustrated in FIGS. 12–13, outline the process of creating an SGO:

Step 1. Object creation. The designer creates a graphical object and writes a DynProp to define dynamic behavior. This step was discussed previously.

Step 2. Templating. The designer associates the GMS variables used in the DynProp with tag attributes from the process database and assigns an update rate. Since the actual tag is unknown at the time an SGO is created, a token or placeholder is specified instead. Token will be assigned to process tags during the bind step. After completion of the Template function, the object is referred to as an SGO. SGOs can be placed in the library for general purpose use by other models.

Step 3. Binding. The tokens specified during the Template step are associated with tags from the process database and a server. This allows the system to associate each GMS variable with both a tag and attribute in the process database. After completing the Bind function, the SGO is referred to as a Bound SGO.

The ability to assign attributes independently of the tag promotes the creation and reuse of complex objects and is a key feature of the computer implemented object oriented system graphics system.

COMPUTER IMPLEMENTED OBJECT ORIENTED SYSTEM EDITOR

The computer implemented object oriented system editor creates model files and registers them for display to the operator. The computer implemented object oriented system editor is a modified version of the Draw2x editor from SL Corporation. This modified editor provides the same functionality found in Draw2x along with the following additional features:

Assignment of GMS script variables to the process database.

Validation of database references using the computer implemented object oriented system model compiler.

Registration of models for display to the operator.

These functions, as well as others, are described in detail below.

Define, Template and Bind Functions

This section describes the editor functions which link objects in a model to a dataserver. All objects contained in a model which exhibit dynamic behavior require a dynamic script or DynProp to define the actions of the object. Variables used in these scripts, known as GMS variables, must be linked to variables from the process database. This allows the object to exhibit dynamic behavior when displayed to process operators using the computer implemented object oriented system run time (VRT) software.

The assignment of GMS variables to the process database occurs using one of two methods. Using the Define method, GMS script variables are assigned to a valid tag and attribute in the process database. Using the Template and Bind functions, script variables are associated using a two step process which assigns the tag and attribute information independently. The second method produces an object known as a Smart Graphical Object, or SGO.

Figure 14:
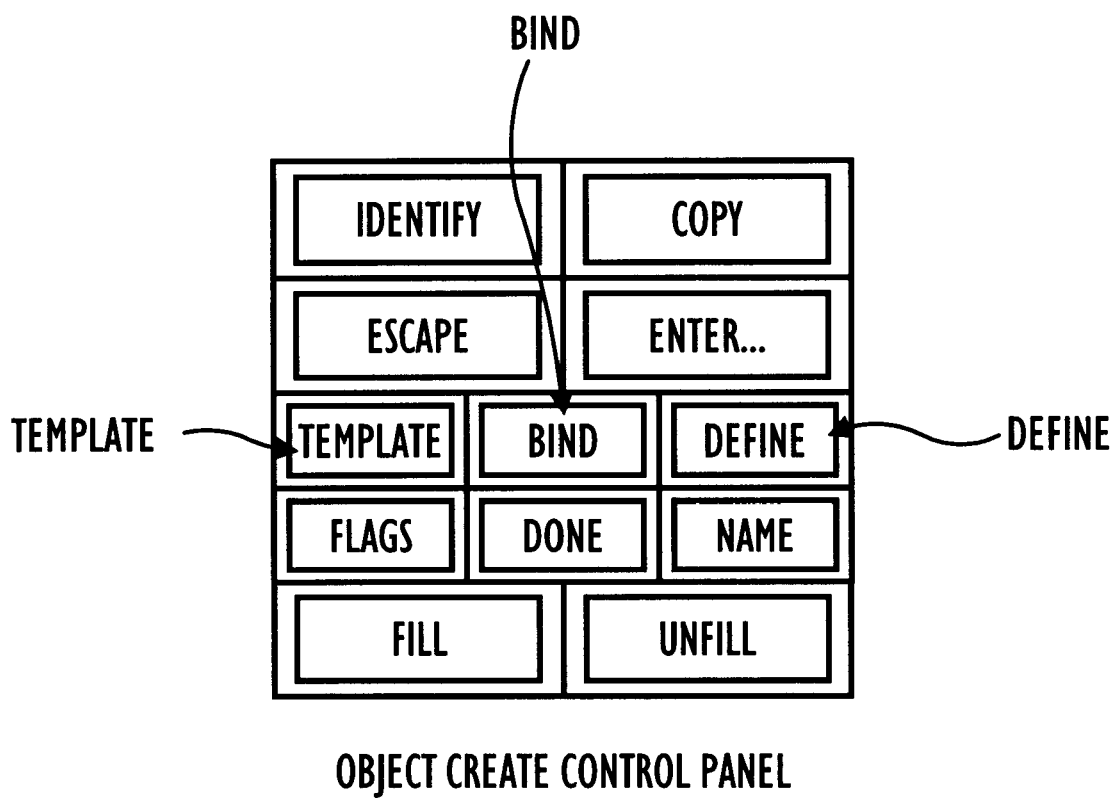
FIG. 14 is a diagram illustrating define, template, and bind functions in the editor system for the computer implemented object oriented visualization system.

To invoke the Define, Template or Bind functions, click on the button in the Object Create Control Panel which is located on the left side of the editor window, as illustrated in FIG. 14.

Define, Dialog

The Define function allows the developer to assign GMS script variables to a tag and attribute in the process database. To invoke the Define function, select one or more objects containing a DynProp and click on the Define button in the Object Create Control Panel. This action invokes the Define dialog sequentially for each object on the select list. If the dialog does not appear, make sure one or more objects are selected and that they contain scripts with unassigned GMS variables.

The Define dialog contains the information needed to assign a GMS variable to a tag in the process database. GMS variables are shown in the list on the right side of the dialog. By clicking on a variable in the list, the assignments for that variable are shown on the left side of the dialog box. In the example shown, a simple rectangle object was created and assigned the following dynamic script.

\* fcolor tank_color

This script assigns the fill color of the rectangle to the GMS variable tank_color. When the rectangle object is selected and the Define function is invoked for this object, the GMS variable tank_color appears in the list of GMS variables. After clicking on the variable tank_color, the following assignments are displayed in the dialog box:

| | |
|---|---|
| Tag: | DEV101 |
| Attribute: | DEV_STAT |
| Server: | <server name> |
| Update Rate: | 1 Second |
| Continuous Update: | Disabled |

Figure 15:
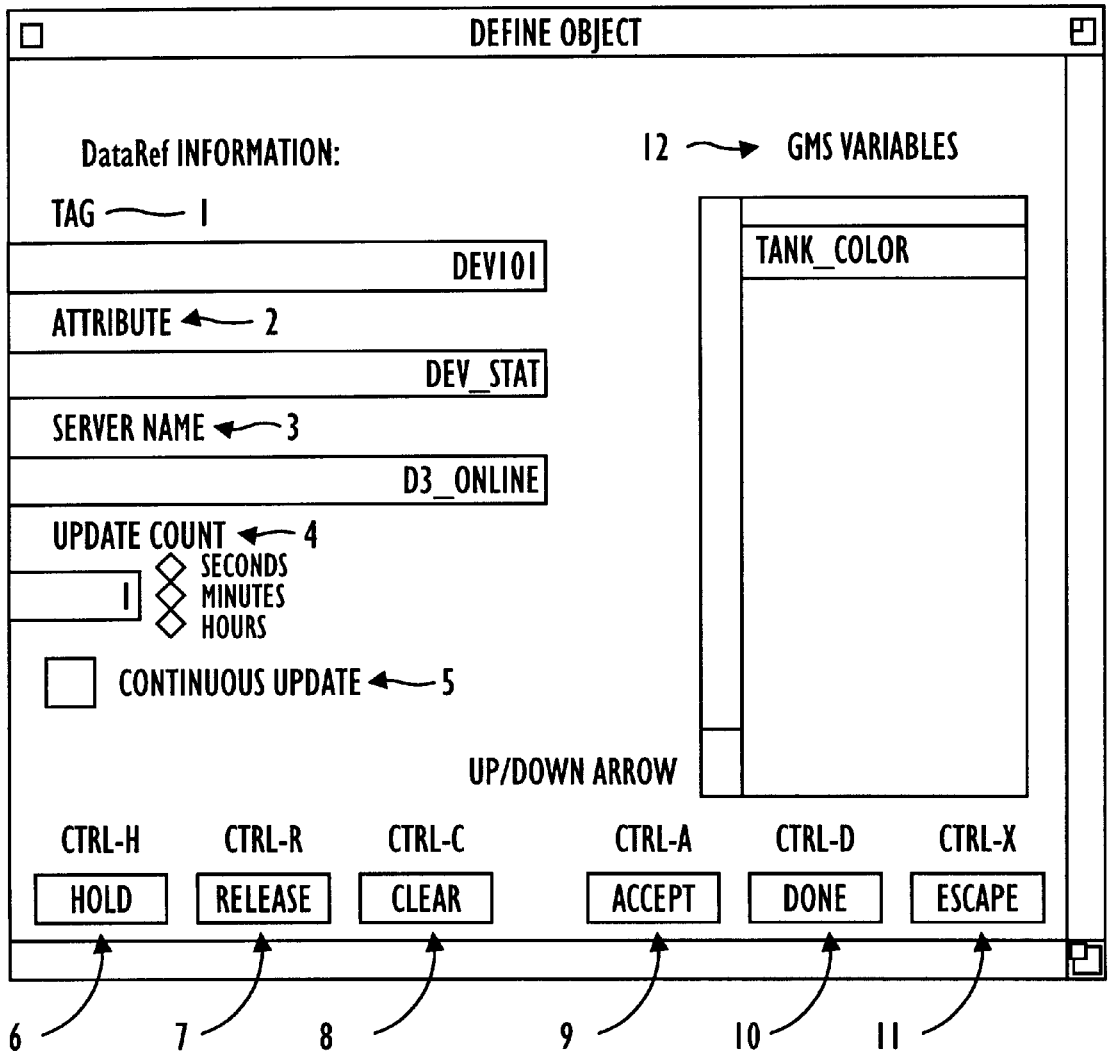
FIG. 15 is a diagram illustrating a define function to assign script variables in the editor system for the computer implemented object oriented visualization system.

To change a field, click on it with the mouse and press the backspace key to erase the individual characters or "<CTRL>u" to erase the entire field. Type in the new value and press the return key to complete the text entry process. After assigning all fields, press the Accept button to save the changes. To close the dialog, press the Done button. The fields and buttons contained in this dialog are described below, and illustrated in FIG. 15:

1. Tag—Server dependent field which determines the data to be fetched for the selected GMS variable. Refer to the standard server documentation to determine the correct syntax for the tag field.
2. Attributes—Server dependent field which assigns an attribute for the given tag. Refer to the server documentation to determine the correct syntax for the attribute field.
3. Server—Enter the name of the server for the given tag and attribute.
4. Update Count—Indicates how often the item is fetched from the server when displayed. An update count of 0 displays the variable information when the model is first displayed but does not refresh it. An update count of 0 is normally used for static strings or other attributes that do not change. To minimize server loading, do not fetch data more often that necessary.
5. Continuous Update—Click on this option to refresh the variable at every update count. If the option is disable, computer implemented object oriented system updates the model on a report by exception basis to minimize network loading. Report by exception means that no values are provided by the server if the process value has not changed since the last update period.
6. Hold—Copy the contents of the Tag, Attribute, Server Name, Update Count and Enable Continuous Update fields in the hold buffer. Contents are held for the duration of the editing session or until changed by clicking the Hold button again. Leaving the Define SGO Object window does not affect the hold buffer; changing between Models also does not affect the hold buffer. The keyboard accelerator key "<CTRL>h" also invokes this function.
7. Release—Pastes the contents of the hold buffer to the Tag, Attribute, Server Name, Update Count and Enable Continuous fields. The keyboard accelerator key "<CTRL>r" also invokes this function. To make the changes permanent, click on the Accept button or type "<CTRL>a".
8. Clear—Clears the Tag, Attribute, Server Name, Update Count and Enable Continuous Update fields for the selected variable. The keyboard accelerator key "<CTRL>c" also invokes this function.
9. Accept—Assigns the tag, attribute, server name, update count and enable continuous update to the current GMS variable. The information must be accepted in order for it to be saved. The keyboard accelerator key "<CTRL>a" also invokes this function.
10. Done—Signals that editing is complete for the current object or SGO. Click on the Done button to either view the next object on the select list or to close the Defined SGO Object window if there are no remaining items on the select list. The Done button can be activated by pressing the right mouse button or using the keyboard accelerator key "<CTRL>D".
11. Escape—Close the Define SGO Object window regardless of the remaining items on the select list. Changes that have not been accepted are lost. The keyboard accelerator key "<CTRL>x" also invokes this function.
12. GMS Variables—A list of all the unassigned GMS variables used in the DynProp to characterize the object or SGO. Click on the variable name to be defined. The selected variable's background color will become white. The up and down cursor keys scrolls the display to the next variable in the list.

When using the Define function, make sure that the GMS variable names in the object are unique between all the other objects in the model. If variable names are not unique, then multiple variables will be bound to the same tag. When this happens, some objects may be driven from the wrong data source.

Template Dialog

The Template function creates a Smart Graphical object, or SGO. To invoke the Template function, select one or more objects containing dynamic scripts and click on the TMPLAT button in the Object Create Control Panel. This action invokes the Template SGO dialog sequentially for each object on the select list. If the dialog does not appear, make sure one or more objects are selected and that they contain scripts with unassigned GMS variables.

The Template SGO dialog contains the information needed to assign a GMS variable to an attribute in the process database. It is the first step in a two step process that assigns a data source to a GMS variable. Unlike the Define function, the process database tag is not specified at this time. Instead, a token is assigned in place of the tag. During the Bind step, the token will be assigned to the actual process tag.

GMS variables are shown in the list on the right side of the dialog. By clicking on a variable in the list, the assignments for that variable are shown on the left side of the dialog box. In the example shown, an object was created and assigned a dynamic script. Part of that script is shown below:

```
dev_stat
= 1
fcolor 10
= 2
fcolor 11
```

This script assigns the fill color of the object to one of two values based on the value of the GMS variable dev_stat. When the object is selected and the Template function is invoked for this object, the GMS variable dev_stat appears in the list of GMS variables. After clicking on the variable dev_stat, the variable is highlighted and the following assignments are displayed in the dialog box.

| Token: | EPN_TAG |
|---|---|
| Attribute: | STATUS |
| Update Rate: | 1 second |
| Continuous Update: | Disabled |

Figure 16:
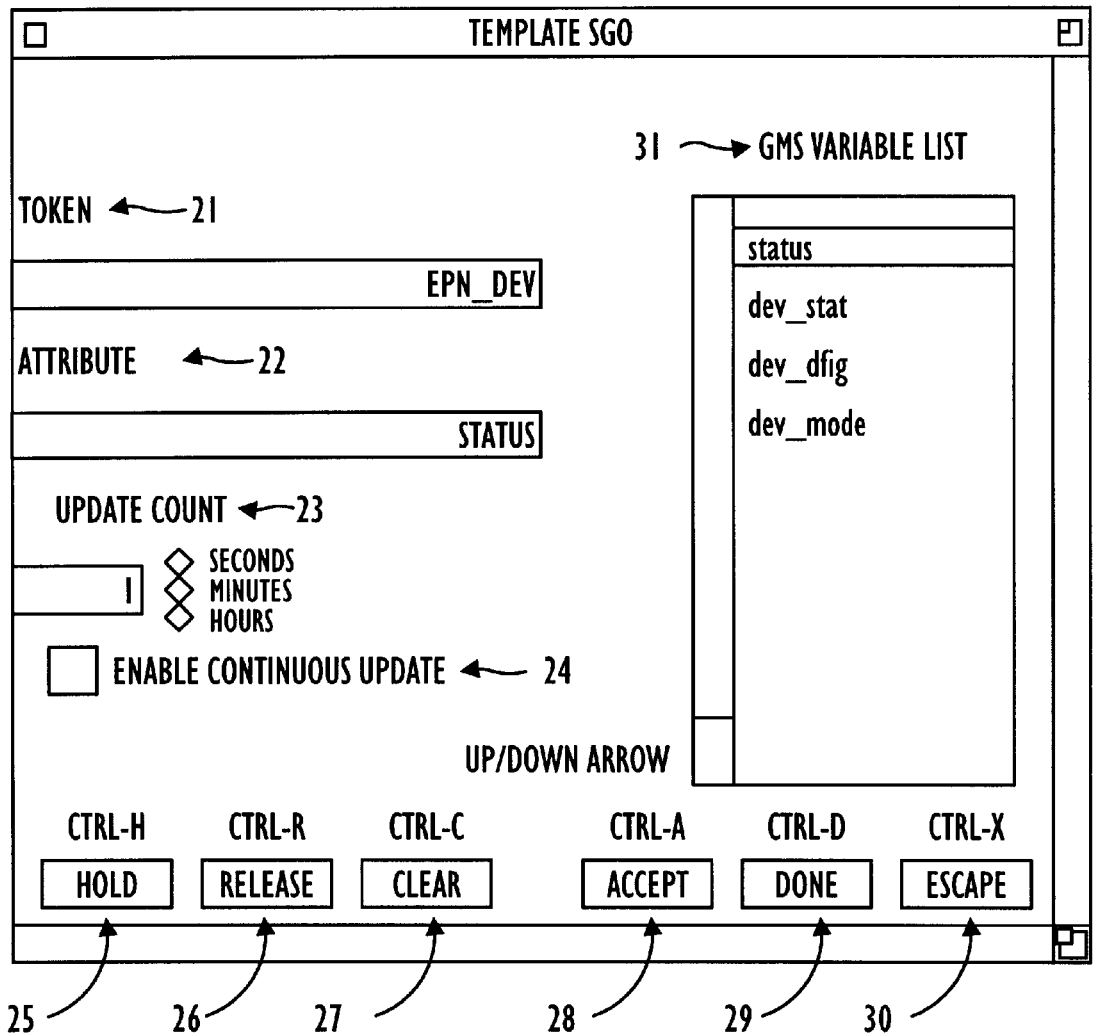
FIG. 16 is a diagram illustrating a template function to create a smart graphical object in the editor system for the computer implemented object oriented visualization system.

The fields contained in the Template dialog are described below, and illustrated in FIG. 16.

21. Token—An arbitrary string used as a place holder for the process tag. The same token may be assigned to multiple GMS variables or multiple tokens may be assigned for attributes that represent different process tags. Do not use the same name for the token as the actual process tag, attribute name or GMS variable name.
22. Attributes—Server dependent field which assigns an attribute for a process tag. (The tag will be assigned during the Bind step.) Refer to the server documentation to determine the correct syntax for the attribute field.
23. Update Count—Indicates how often the item is fetched from the server when displayed. An update count of 0 displays the variable information when the model is first displayed but does not refresh it. An update count of 0 is normally used for static strings or other attributes that do not change. To minimize server loading, do not fetch data more often than necessary.
24. Continuous Update—Click on this option to refresh the variable at every update count. If the option is disabled, the computer implemented object oriented system updates the model on a report by exception basis to minimize network loading. Report by exception means that no values are provided by the server if the process value has not changed since the last update period.
25. Hold—Copy the contents of the token attribute, update count and enable continuous update fields in the hold buffer. Contents are held for the duration of the editing session or until changed by clicking the Hold button again. Leaving the Template SGO window does not affect the hold buffer, changing between Models also does not affect the hold buffer. The keyboard accelerator key "<CTRL>h" also invokes this function.
26. Release—Pastes the contents of the hold buffer to the Token, Attribute, Server Name, Update Count and Enable Continuous Update fields. The keyboard accelerator key "<CTRL>r" also invokes this function. To make the changes permanent, click on the Accept button or type "<CTRL>a".
27. Clear—Clears all Token, Attribute, Server Name, Update Count and Enable Continuous Update fields for the selected variable. The keyboard accelerator key "<CTRL>c" also invokes this function.
28. Accept—Assigns the Token, Attribute, Server Name, Update Count and Enable Continuous Update fields to the current GMS variable. Changes may be accepted once after all variables in the list have been assigned. The keyboard accelerator key "<CTRL>a" also invokes this function.
29. Done—Signals that editing is complete for the current object. Click on the Done button to either view the next object on the select list or to choose the Define SGO Object window if there are no remaining items on the select list. The Done button can be activated by pressing the right mouse button or by typing "<CTRL>d".

30. Escape—Close the Template SGO window regardless of the remaining items on the select list. Changes that have not been accepted are lost. The keyboard accelerator key "<CTRL>x" also invokes this function.

31. GMS Variables—A list of all the GMS variables used in the DynProp to characterize the object. Click on the variable name to be templated. The selected variable's background color will become white. The up and down cursor keys scrolls the display to the next GMS variable in the list.

Bind Dialog

The Bind function assigns a process tag to a Smart Graphical Object, or SGO. During the Template step, the GMS variables used by an object were assigned to attributes in the process database and one or more tokens were assigned to serve as place holders for process tags. The Bind function assigns the SGO tokens created during this step to tags in the process database.

Binding is typically performed when creating a top level model. Every SGO needs to be bound to the process database before the model can be registered. When using SGO's from a palette or the object library, binding is the only step necessary to enable dynamic object behavior. To invoke the Bind SGO dialog, select one or more SGO objects and click on the Bind button in the Object Create Control Panel. If the dialog does not appear, either no objects are selected or the selected object is not an SGO object.

Figure 17:
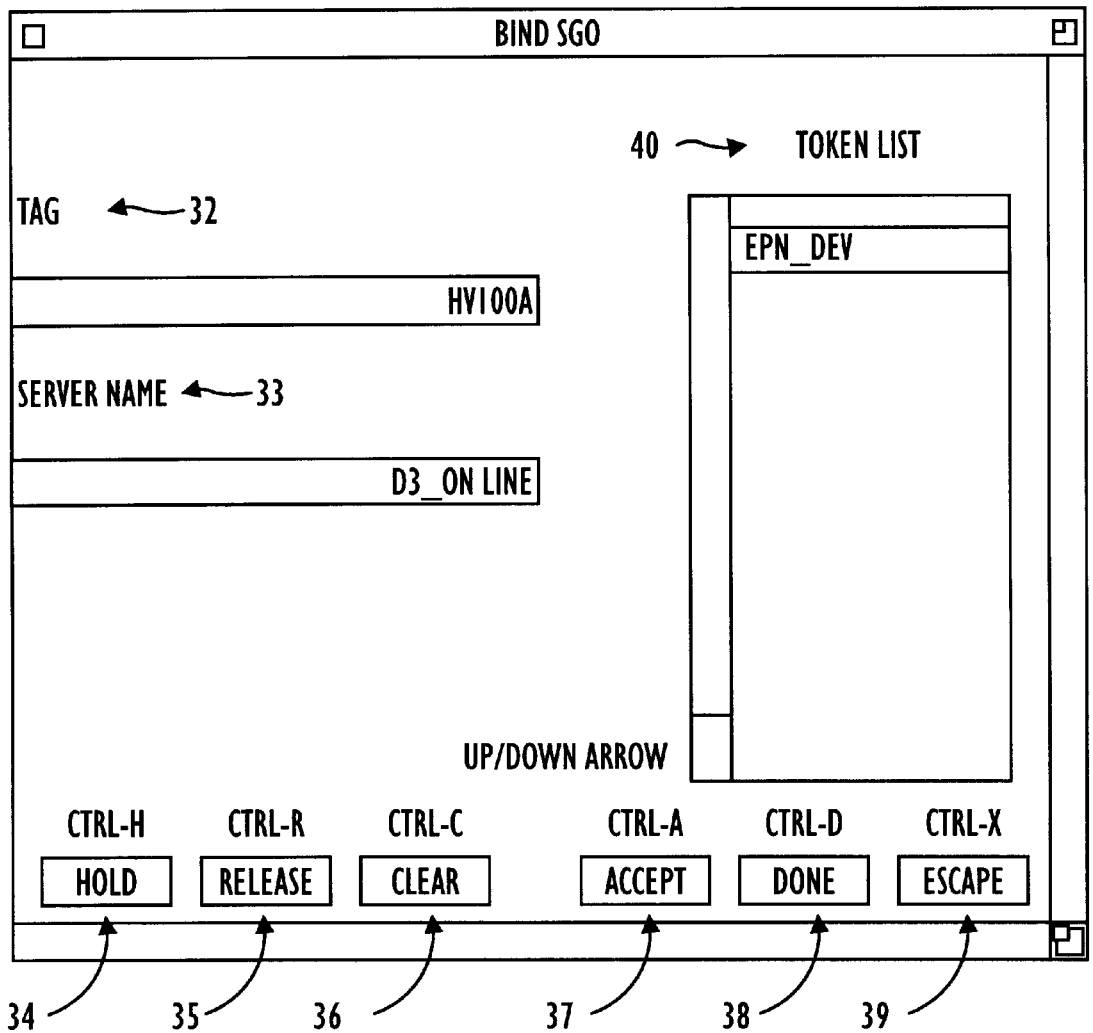
FIG. 17 is a diagram illustrating a bind function to assign a process tag to a smart graphical object in the editor system for the computer implemented object oriented visualization system.

Tokens assigned to the process attributes during the Template step appear in the list on the right side of the dialog and the tag assigned to the selected token is shown in the fields on the left side of the dialog window. To view the assignments for a toke, click on the token in the token list or use the arrow keys to change the current selection. To change a field, click on it with the mouse and press the backspace key to erase the individual characters or "<CTRL>u" to erase the entire field. Type in the new value and press the <return>key to complete the text entry process. After assigning all fields, press the Accept button to save the changes. To close the dialog, press the Done button. The fields contained in this dialog are described below and illustrated in FIG. 17.

32. Tag—This field shows the process tag assigned to the highlighted token displayed in the Token List.

33. Server Name—Enter the server name providing information for the designated tag.

34. Hold—Copy the contents of the tag and server name to the hold buffer. Contents are held for the duration of the editing session or until changed by clicking the Hold button again. Leaving the Bind SGO window does not affect the hold buffer, changing between Models also does not affect the hold buffer. The keyboard accelerator key <CTRL>H also invokes this function.

35. Release—Pastes the contents of the hold buffer to the Tag and Server Name fields. The keyboard accelerator key "<CTRL>r" also invokes this function. To make the changes permanent, click on the Accept button or type "<CTRL>a".

36. Clear—Clears the Tag and Server Name fields for the selected token. The keyboard accelerator key "<CTRL>c" also invokes this function.

37. Accept—Assigns the Tag and Server Name to the tokens in the list. The information must be accepted to make changes permanent. The keyboard accelerator key "<CTRL>a" also invokes this function.

38. Done—Signals that editing is complete for the current object. Click on the Done button to either view the next object on the select list or to close the BIND SGO window if there are no remaining items on the select list. The Done button can be simulated by pressing the right mouse button or by typing "<CTRL>d".

39. Escape—Close the Bind SGO window regardless of the remaining items on the select list. Changes that have not been accepted are lost. The keyboard accelerator key "<CTRL>x" also invokes this function.

40. Token List—A list of tokens for this object created during the Template step. Click on a token to see the current tag and server assignments. Use the up/down arrow keys to change the selected token.

COMPUTER IMPLEMENTED OBJECT ORIENTED SYSTEM MODEL COMPILER

The computer implemented object oriented system model compiler processes files created by the computer implemented object oriented system editor to prepare them for display to the operator. The computer implemented object oriented system model compiler, or VMC, may be accessed from the system command prompt or from the computer implemented object oriented system Editor using the Register Model Function.

To access the VMC from the system prompt, type the command $ SET DEFAULT VED_MODEL $ VMC <model> followed by one or more of the options discussed below. "<model>" is the name of the M1 file as saved by the computer implemented object oriented system Editor. If the compiler is not run from the VED_MODEL directory, not all submodels may be found during the compilation.

Options:

[-m] Computer Implemented Object Oriented System Registry Model Name

The parameter following this argument is to be a unique string to be displayed in the computer implemented object oriented system run time directory window. The model name can be enclosed in double quotes to include spaces.

[-c] Convert M2 file to G file

The compiler will accept an M2 file and save it as a standard G file in SL-GMS. SL-GMS does not guarantee that all data from the M2 file will be saved in the G file. VMC will print warning messages if this occurs.

[-d] Description

This parameter will be displayed in the computer implemented object oriented system Run Time directory window when the model name is selected. The description can be enclosed in double quotes to include spaces.

[-w] treat validation errors as Warnings

Under normal operations, the compiler will not register a model if there are any errors resulting from unbound Tokens, or invalid points. Using the -w switch will force the compiler to ignore those errors, and register the model. This switch does not ignore fatal errors that might occur during the validation process (for example, unable to connect to the Registry).

[-g] Group description

The Group description allows arrangement of models based on a more general subject. The intent is to allow the user to put in a group description and the VRT directory will allow filtering based on group name.

[-h] Hide this model from directory listing

This allows models that are referenced indirectly (such as popup models) to be registered, but not to appear in the user's Registry Directory.

[-k] Kill a model (remove from Registry)

Given a Registry model name (-m switch) the compiler will tell the Registry to delete the given model from the Registry listing, and to delete the M2 file on the primary server.

[-o] compiler Output filename (default: stdout)

The compiler output can be redirected with this switch. Some information (such as summary info, Registry results, or errors) will continue to be printed to the screen and to the output file. Using the -o switch without a filename will generate an output file based on the model name. For example, if the command line is:

vmc test1 -m "This is a test" -o
The output file will be test1.out.
vmc test1 -m "This is a test" -o filex
The output file will be filex.out.

[-i] Include search path

The SL-GMS graphics environment allows additional directories to be searched to retrieve models, submodels, and GISMOS. The computer implemented object oriented system model compiler automatically searches the standard GMS directories for models, and in addition, searches the directory VED_MODEL. The -i switch allows additional directories to be searched before the computer implemented object oriented system specific directories. All directory paths must reside on the same physical device.

[-1#] specify debug level (Default: level 0)

The compiler has various levels of output based on debug levels. As this number increases so does the amount of informational and diagnostic messages describing the internal operations of the compiler. Substitute the desired debug level for the # sign. For example, to specify debug level 2, use the command -l2. (There is generally no space between the letter "l" and the 2.)

[-n] No Validate [-nv], No Register [-nr], or neither [-n]

Use the switch -nr to compile the model, validate the computer implemented object oriented system data, but not to register it. Use the switch -nv to skip any validation, and just register the model. Skipping the validation step essentially causes the compiler to ignore any computer implemented object oriented system specific data. Use the switch -n to skip the validation and registration steps.

[-a] Read command line arguments from argfile based on model name

This instructs the compiler to read from a predetermined file (e.g., VED_MODEL:VMC_ARGFILE.DAT), scan that text file for the line starting with the model name followed by a space, and interpret that line as if it were command line arguments. This should provide for development of a database of names and descriptions so the user does not have to type in the lengthy command line every time they compile the model.

[-s] Save optimized model as G file

This switch allows the user to generate a single G file that contains all the information for the model that was to be registered. This is useful primarily to transfer the model to another system, or to have a text file for archival or reporting purposes. The file is written to a predetermined directory (e.g., VMR_G).

[-v] Verbose informational messages

If the Verbose switch is turned on, the compiler outputs additional reporting information during the compilation process. Any output generated can be redirected to an output file with the -o switch.

[-p] Register precompiled model

A precompiled model is a model built against a database that differs from the current system. This function is often used for popup models. By using precompiled models, objects such as faceplates can be validated and registered without knowing specific tags in the process database.

There are 3 steps required to build a precompiled model. First, build a model and compile it using a valid database. This step validates the Tags and Attributes contained in the model. Second, convert the resulting M2 file to a G file using the -c option. Finally, convert the G file to an Ml file using the standard GM1 utility.

The following command compiles a model named reactor. It assigns a model name of Reactor_A with a description of "Reactor A Cooling Vat". The model will be registered upon completion even if warnings are generated. Once registered, the model will be available for operator display:

vmc reactor -m Reactor A -d "Reactor A Cooling Vat" -w

Convert=>reactor.M1 to reactor.M2

Vision Model Name=>Reactor_A

Description=>Reactor A Cooling Vat

Validation=>Treat Valid. Problems as Warnings

Output=>Sending output to stdout (default)

STANDARD COMPUTER IMPLEMENTED
PROCESS EXAMPLES

Computer Implemented Object Oriented System Graphics Editor (VED)

Figure 18:
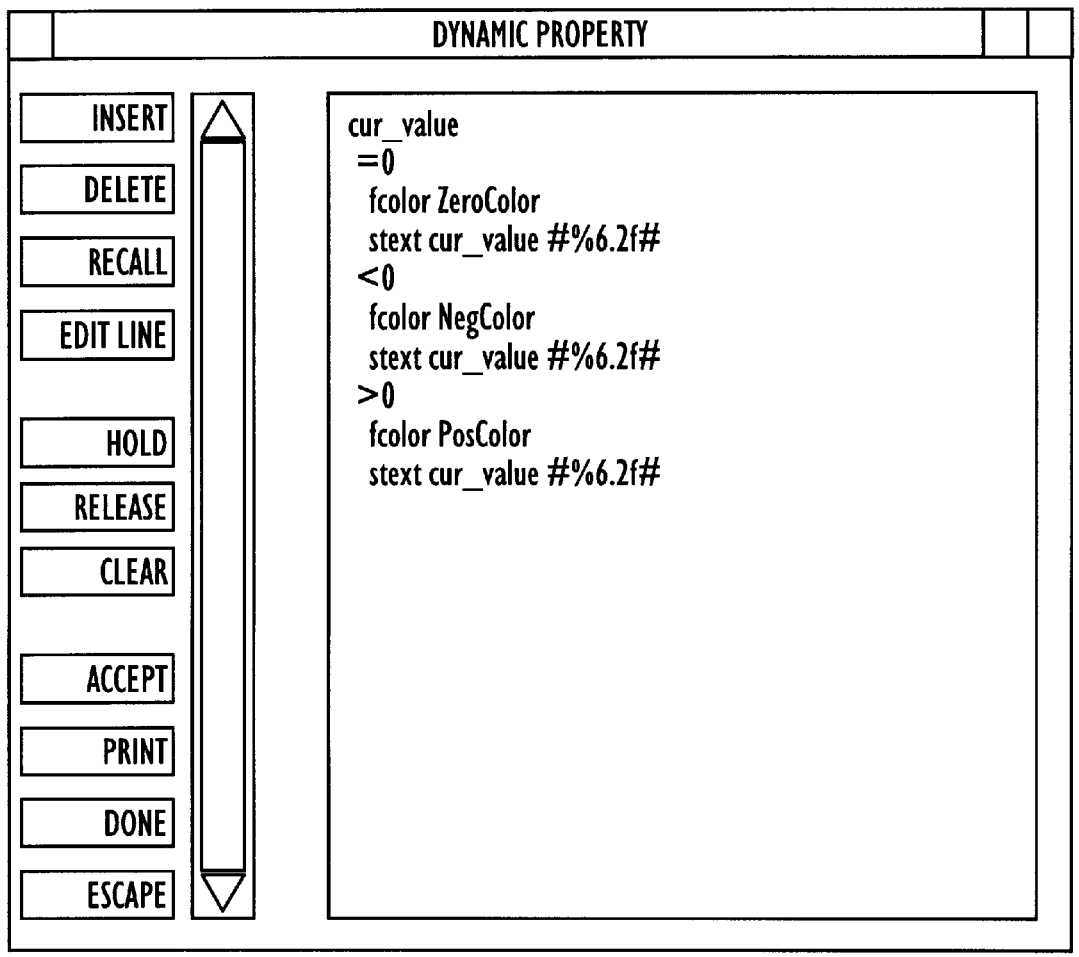
FIG. 18 is a diagram illustrating a dynamic property function to assign a dynamic property to a smart graphical object in the editor system for the computer implemented object oriented visualization system.

This tutorial, illustrated in FIG. 18, is designed to give a quick walk through of all the steps necessary to create working models within a standard server environment, such as the S/3 environment available via GSE Systems, Inc., in Columbia, Md.

1) Set your default directory to be: S3$DISK: [VED.MODEL] $ set def VED_MODEL

2) Invoke the Vision Editor
   a) $VED
   b) select Veditor through the Applications Menu Bar 3) The low level pieces which comprise a model are known as the FUNDAMENTAL OBJECTS. These objects basically describe what you want this object to do functionally, without any details being associated to a particular database object (EPN or point type). A script language is used to detail the dynamics of the object. An example of a fundamental object could be a text box with some associated action. The following shows how to create such an object.
   a) Select "Clear Parts" from Model pull-down menu.
   b) Select "Clear Submods" from Model pull-down menu.
   c) Select the Text-Rectangle icon from the object menu on the left of the editor and position the object anywhere on the screen. Draw to the size you desire and select "FILL".
   d) Select "Edit Dyn . . . " from the Dyn pull-down menu.
   e) Select "Insert" and enter the dynamics for the object. An example of something one might enter is listed below:

```
            cur_value
               = 0
                 fcolor ZeroColor
                 stext cur_value "%6.2f"
               < 0
                 fcolor NegColor
                 stext cur_value "%6.2f"
               > 0
                 fcolor PosColor
                 stext cur_value "%6.2f"
``` f) Select "Accept" at the bottom of the menu.
g) Select "Done".
h) Select "Move".
i) Select "Enter".
j) Enter the string "0 0". This moves the object to the origin (0,0) and will make instancing easier.
k) Select "Save as . . . " from the Model pull-down menu and save this model as FUNDAMENTAL1.

This model will be saved and left for an archive while we go on.

5) Templating is the step where the user is associating the variables defined at the fundamental level with a generic tag or label. For instance in a particular fundamental, all fields referenced may be related to a particular type of field equipment; e.g., a pump using an Analog Output point. The token in this instance could be "Pump_Epn". The use of "Pump_Epn" as the token would relate all related attributes (database fields) to this particular pump. If more than one pump existed in the fundamental object then more than one token would be used to uniquely identify which attribute was related to which tag. So, in this instance, the tokens might be Pump_Epn1 and Pump_Epn2.

6) The Attribute is used to access the database field desired. A list of these fields can be found in Appendix A.

Figure 19:
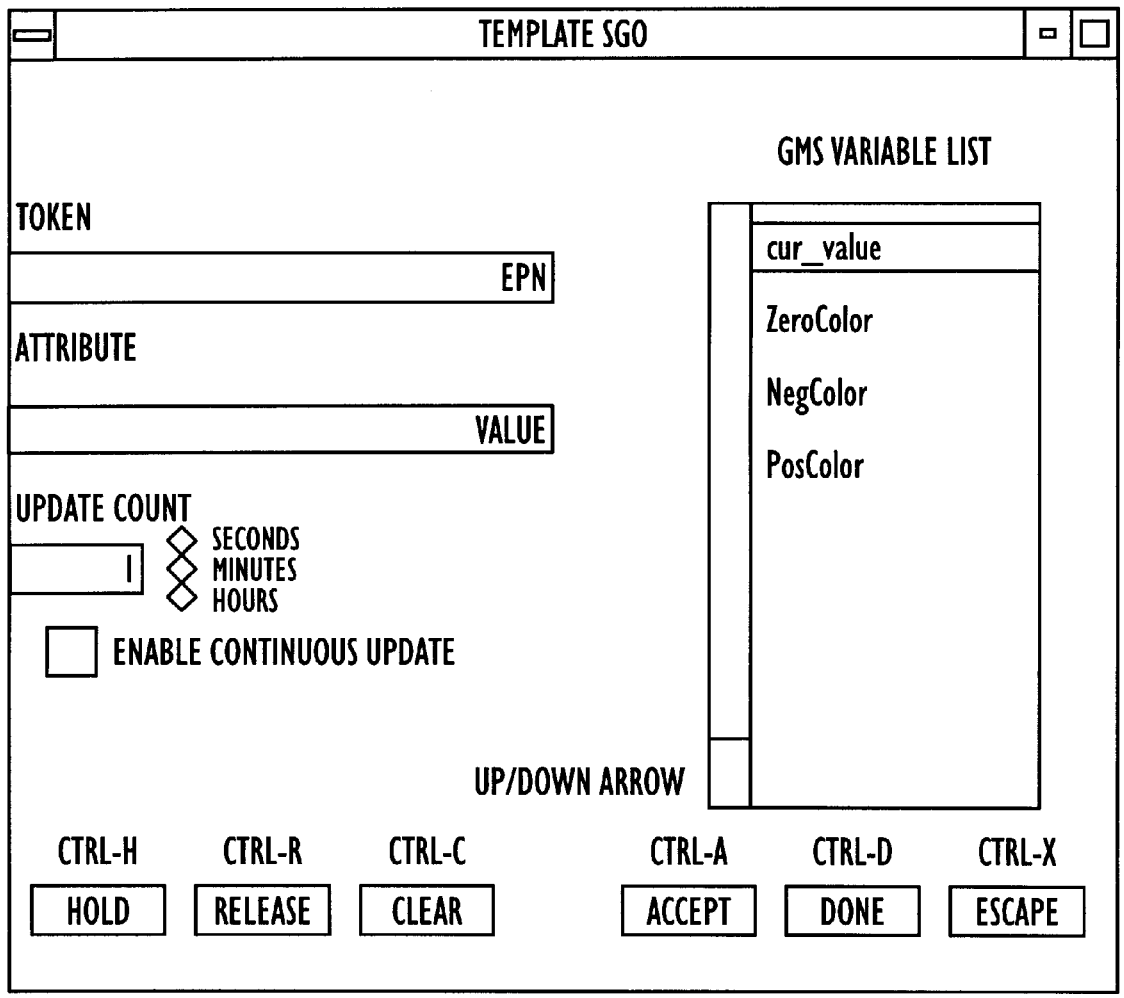
FIG. 19 is a diagram illustrating a bind function to inter-relate properties to a smart graphical object in the editor system for the computer implemented object oriented visualization system.

7) Select "Tmplat" from the command palette at the far left of the editor and click on the GMS variable named "cur_value" and enter in the desired TOKEN and ATTRIBUTE, as illustrated in FIG. 19.

dFor example:

```
         TOKEN:            EPN
         ATTRIBUTE:        VALUE
         UPDATE RATE:      1 SEC
``` a) Select "Accept" at the bottom of the window.
b) Select "Done".
c) Select "Save as . . . " from the Model pull-down menu and save this model as FUNDAMENTAL1_SGO. This model is known as SGO—Smart Graphical Object.
d) Select "Clear Parts" from Model pull-down menu.
e) Select "Clear Submods" from Model pull-down menu.

Figure 20:
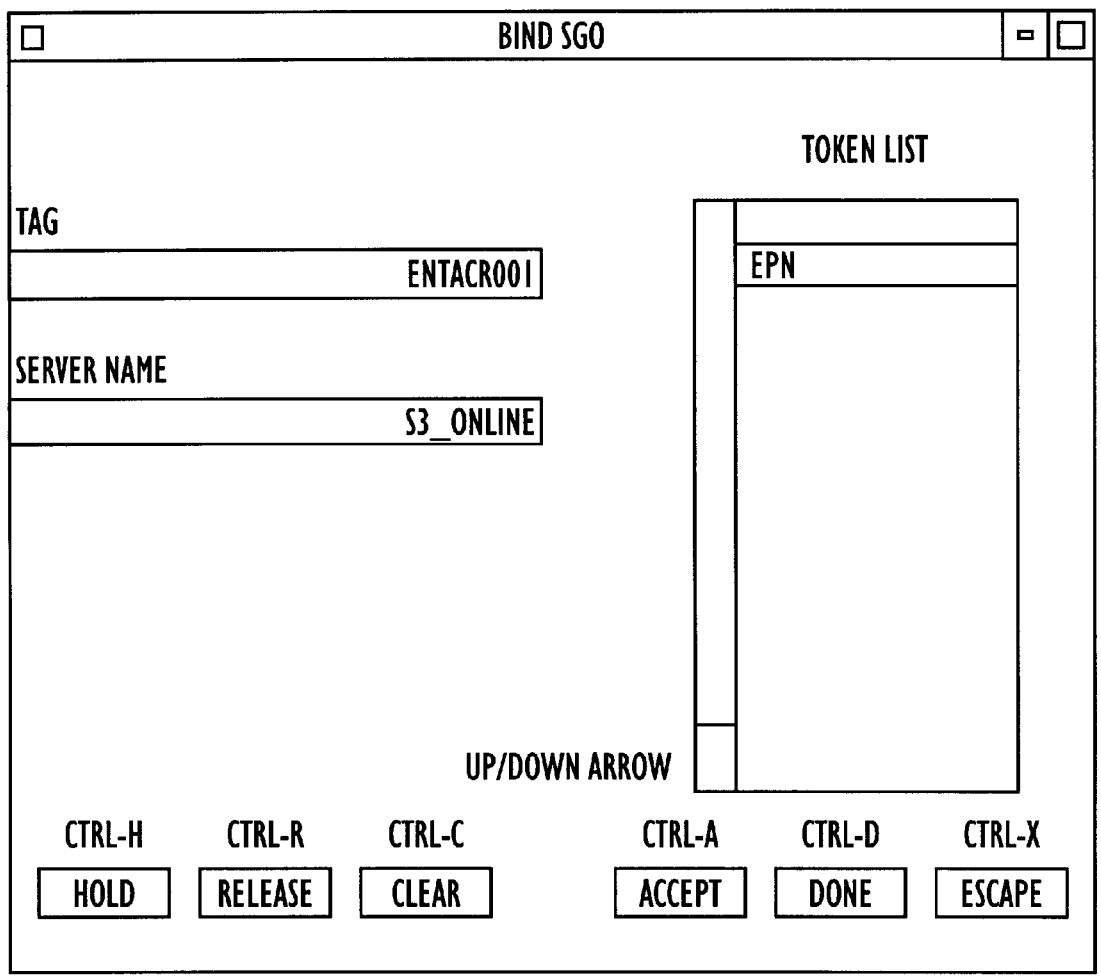
FIG. 20 is a diagram illustrating a template function to assign a dynamic property to a smart graphical object in the editor system for the computer implemented object oriented visualization system.

8) Select "Get External" from the SubMod pull-down menu and select FUNDAMENTAL1_SGO from the dialog box which appears. Click on "Done". A box on the bottom of the Vision Editor screen is now filled with an outline of what the actual model looks like. Use the mouse and click within this box. Move the cursor within the Editor's screen and click to release this "Instance" where you desire. If you desire to relocate this model you can click on the object and select the "Move" button. Once this is done, movement of the cursor with the left mouse button depressed will cause the object to follow this movement within the Editor's window. Releasing the left mouse button will drop the object at the cursor's position within the Editor's window.

a) Select "Bind" from the command palette to the left of the editor.
b) When you BIND a model you are associating actual database points to the data described within the SGO. In our example, we are binding a particular EPN within, for example, a standard S/3 Database to the dynamics and attributes we set up earlier.
c) Enter in the values for the fields outlined below, as illustrated in FIG. 20:
   Root Name: ENTACB001
   Data Source Instance: S3_ONLINE
d) Select "Accept" from the bottom of the window.
e) Select "Done".

9) Select "Rename Vars . . . " form the Dyn pull-down menu, as illustrated in FIG. 21. Accessing renamed variables allow the user to specify constants for certain fields within the dynamics which lends itself to easy modification for future changes.
a) Click the mouse to select the following fields in FIG. 21 and enter in a constant value corresponding to a fill color desired.
For example:
   NegColor 65
   PosColor 5
   ZeroColor 2
b) Select "Accept" on the left of the window.
c) Select "Done" on the left of the window.
d) Select "Save as . . . " from the Model pull-down menu and save this model as, e.g., FUND1_MODEL.

Now we have a model written to disk which is now ready for the next step—REGISTERING THE MODEL.

10) Select "Register Model" from the Model pull-down menu. Registering a Model is also known as compiling the model. This is the step which validates all of the dynamics and establishes the database connections. The runlog will need to be viewed either during or after this process takes place to determine if the operation was successful. A second manner in which one can compile a model is through the use of the VMC command line utility. At the DCL prompt the user can type VMC and view a list of the supported options. For the sake of simplicity, the following command is sufficient for most operations:

$ vmc fund1_model

Examine the resultant messages to determine if the compile was successful. If you are registering the model through the Editor then you will be prompted to save the current model. Saving the model proceeds with the compilation.

Computer Implemented Object Oriented System Navigator

Figure 22:
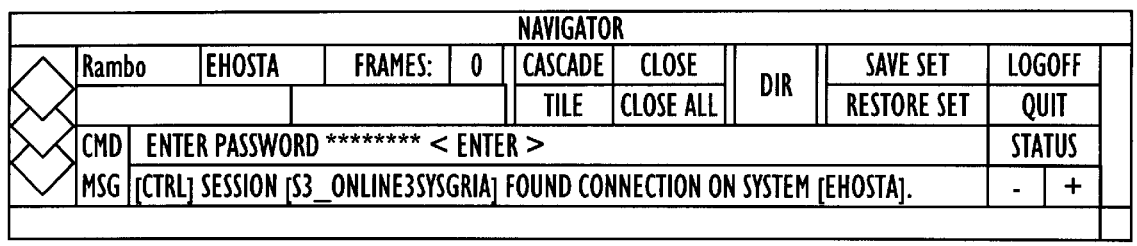
FIG. 22 is a diagram illustrating a navigator function in the Run-Time environment for the computer implemented object oriented visualization system.

This section will walk the user through a sample session, illustrated in FIG. 22, utilizing the Computer Implemented Object Oriented System Navigator (VRT). First, the VRT (Navigator) is initially invoked.

1) Invoke the Navigator.
   a) The Navigator is interactively invoked with the following command.
      $ vrt
   b) Once the executable image is active, a rectangular box is displayed on the screen with the word "Navigator" centered within the window border.
2) Within the Navigator window there exist a number of buttons and display-only information areas.

Figure 23:
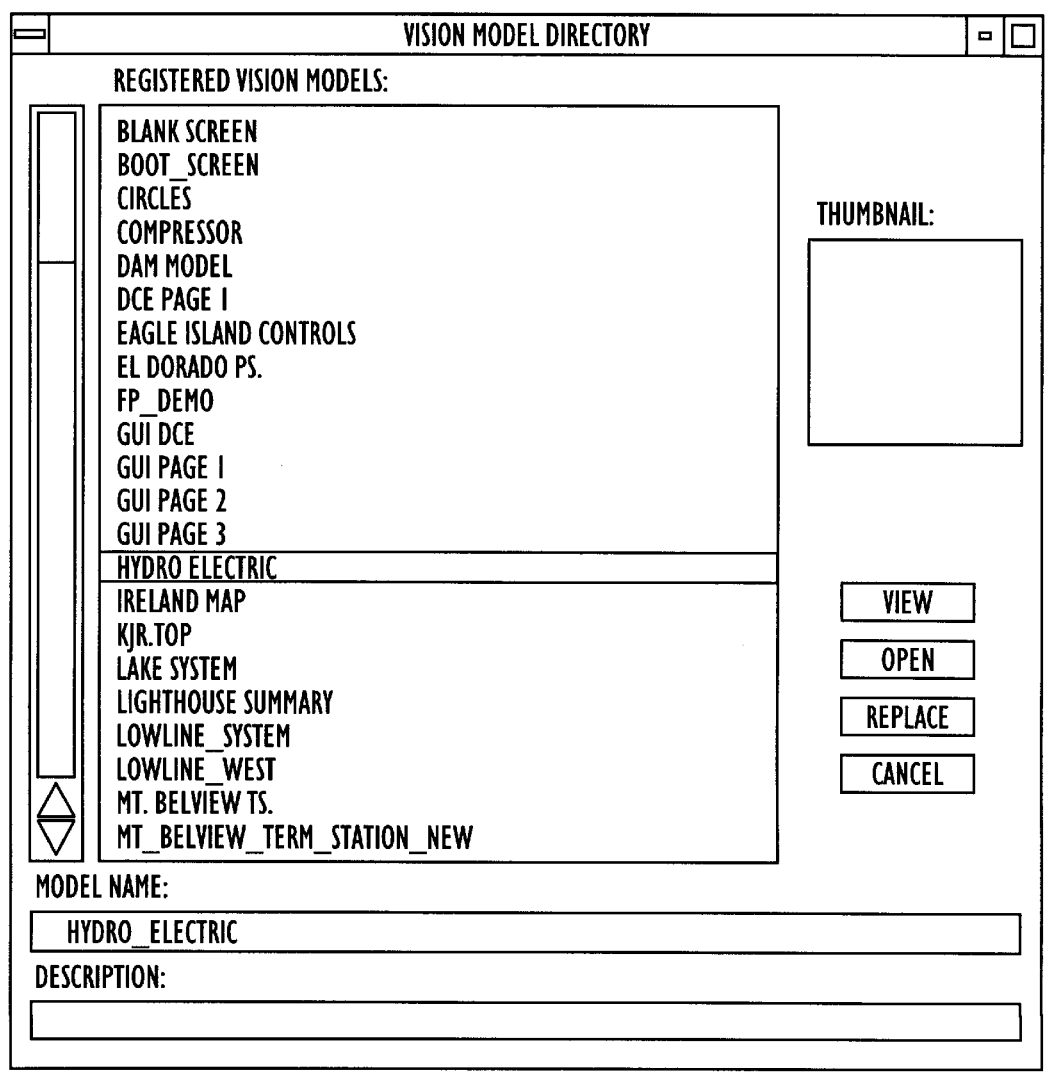
FIG. 23 is a diagram illustrating a model directory function in the Run-Time Environment for the computer implemented object oriented visualization system.

The first button to use is the DIR button. Select this option by clicking within the button containing the word "DIR". Once selected another window will pop up. This is called the "Model Directory Window," illustrated in FIG. 23, and contains a list of all successfully compiled models which are visible to the user. Models which have been compiled with the '-h' (hidden) option will not be displayed within the Directory Window.

Alternately, the user can use the "<CTRL>D" accelerator key to invoke the Model Directory Window. An entry will exist for each model successfully completed.

There are a number of reasons why a model may not compile properly. The following reasons are listed in the event the user tries to compile their own model. The reasons listed below are not a comprehensive list, but just a few of the more common reasons why a model may not compile properly.

Syntax Error within the model

The model has references to database fields that have not been bound to points within the database.

One or more components of the computer implemented object oriented system are not currently active. Verify that the on-line server is running.

A faulty network connection is preventing communication with the on-line server.

Once models exist within the Model Directory, select one by clicking on the line with that model. The selection is then highlighted. There are a number of options within the Model Directory window. The following is a summary of these options and a brief description of their functionality.

"View"—selecting this option will allow the user to preview what the model looks like within the "Thumbnail" view provided within the Model Directory window.

"Open"—selecting this option will create a NEW window (or frame) containing this particular model. The location of this and subsequent new windows (as is the maximum number of frames open at any one time) is configurable within the following resource file: VRT_ROOT:VRT_RESOURCES.DAT "Replace"—selecting this option will create a new frame if no frame is currently opened; otherwise the frame which has focus will be replaced with this model. Focus is denoted by a blue background in the frame's button bar.

"Cancel"—selecting this button terminates any further selection and closes the Model Directory.

There are a few other display only fields located within the Model Directory window. They include the following.

Model name—Under the scrolling window which contains the list of available models is the name of the model which is currently selected.

Description—Located in the Description box is any description which was included when the currently selected model was compiled.

3) After selecting a model, press the OPEN button and verify the model is displayed properly. Select another model and press the OPEN button as well. You will notice how each new frame is aligned with the previous frame. When you are done selecting models from the Directory window, select "Cancel" from the bottom-right portion of the Directory window.

4) Select the TILE button from the Navigator window and notice how the displayed models are displayed in a window pane arrangement.

5) Select the CASCADE button and notice how the displayed models are returned to their original size and position.

6) Select the CLOSE button and verify that the model window which currently has focus us removed from the screen and that the Frame count is decremented by one.

7) Select the CLOSEALL button and verify that all of the displayed model windows are removed from the screen and that the frame count returns to zero.

8) Select the STATUS button and the current status of all servers will be displayed in the message area.

9) Selecting the LOGOFF button can result in one of several outcomes:
   If no one is logged in, nothing will occur.
   If a user other than "Supervisor" is logged in, that user is logged off and also logs the user out.
   If the user logged in is Supervisor, then no logoff will occur. This parallels the fact that when Supervisor is the current user logins and logouts are disabled.
   If the current Navigator user is the SuperUser, logging off will revert the user to their previous state—either logged in as the current operator, or not logged in at all.

10) Select the MINUS (-) button. This button will clear the Command and Message lines within the Navigator window.

Figure 24:
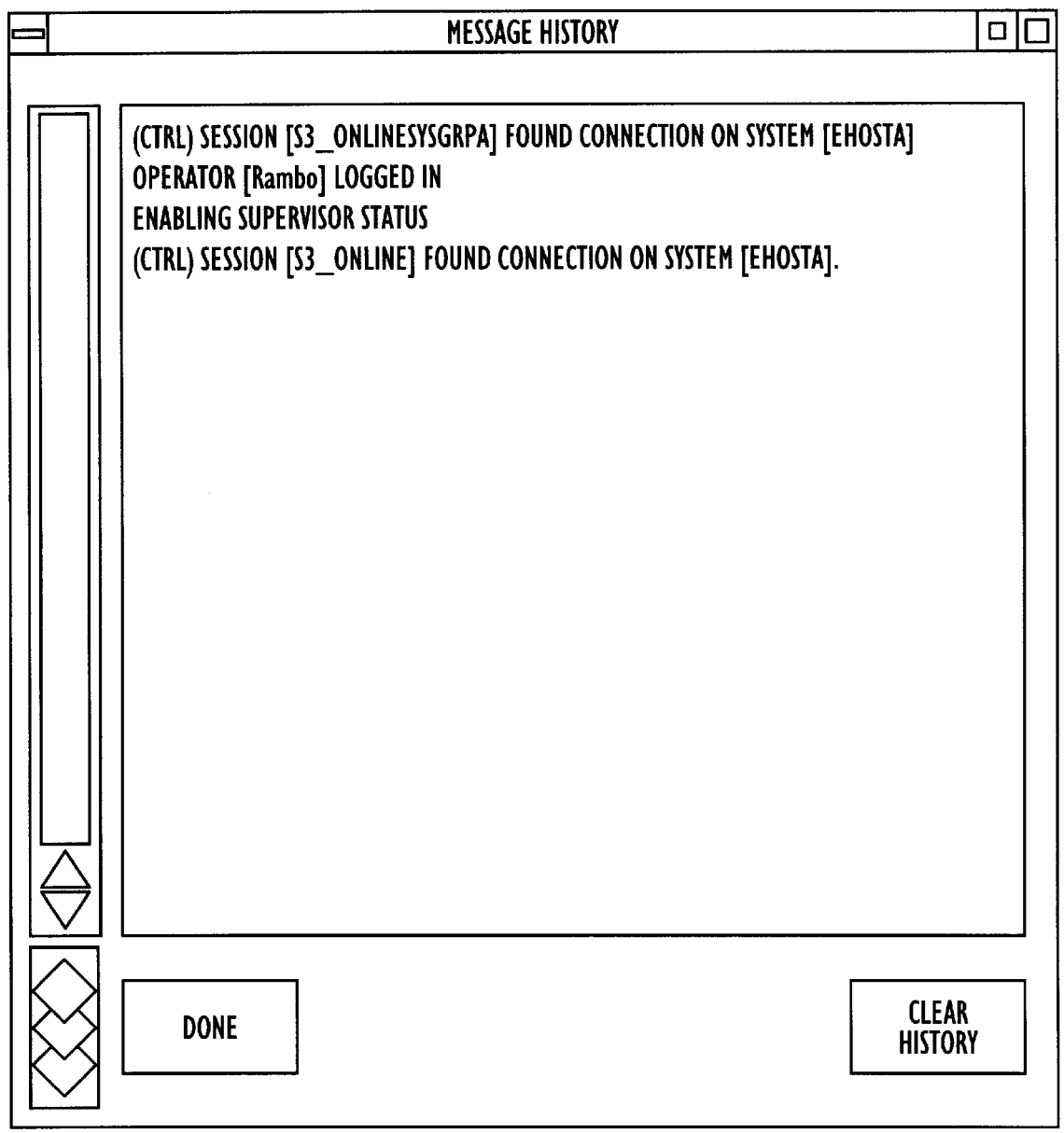
FIG. 24 is a diagram illustrating a message history function in the Run-Time environment for the computer implemented object oriented visualization system.

11) Select the PLUS (+) button. This button will cause the Message History window, illustrated in FIG. 24, to be displayed showing a log of the activity which has previously occurred. Within the Message History window there are two buttons and one scroll bar.
   The scroll bar enables the user to view messages which exist beyond the current window view.
   The CLEAR HISTORY button will erase the current contents of the Message Window.
   The DONE button will close the Message History window and return control back to the Navigator.
   These messages are also stored in the VRT runlog for the session, prepended with a date/time stamp for each message.

12) Select the QUIT button to exit the Navigator completely. Control will then be returned to your operating system.

Computer Implemented Object Oriented System Demo Graphics

The model CIRCLES is provided as a sample of the kind of graphics which can be created with the computer implemented object oriented system graphics. This portion of the tutorial covers the model called CIRCLES, a model which demonstrates some of the interesting things which can be accomplished with the computer implemented object oriented system.

All finished graphics are, for example, in the directory VSN$DISK:[VED.MODEL]. This is the recommended directory for top level models which will be registered and displayed from the Navigator. The logical VED_MODEL is defined to be this directory. The SGO, GISMO and non-dynamic object libraries are in the directory VED_SGO, and copied to VED_GISMO. Any modifications which the user wishes to make should be done in the VED_GISMO directory.

The palette models (but not the items on the palettes) are in the directory VED_PALETTES. Any new palette models which are created should be put in this directory. The directory VED_SUBMODS should be used for custom or project-specific SGOs and non-dynamic objects.

Circles

Figure 25:
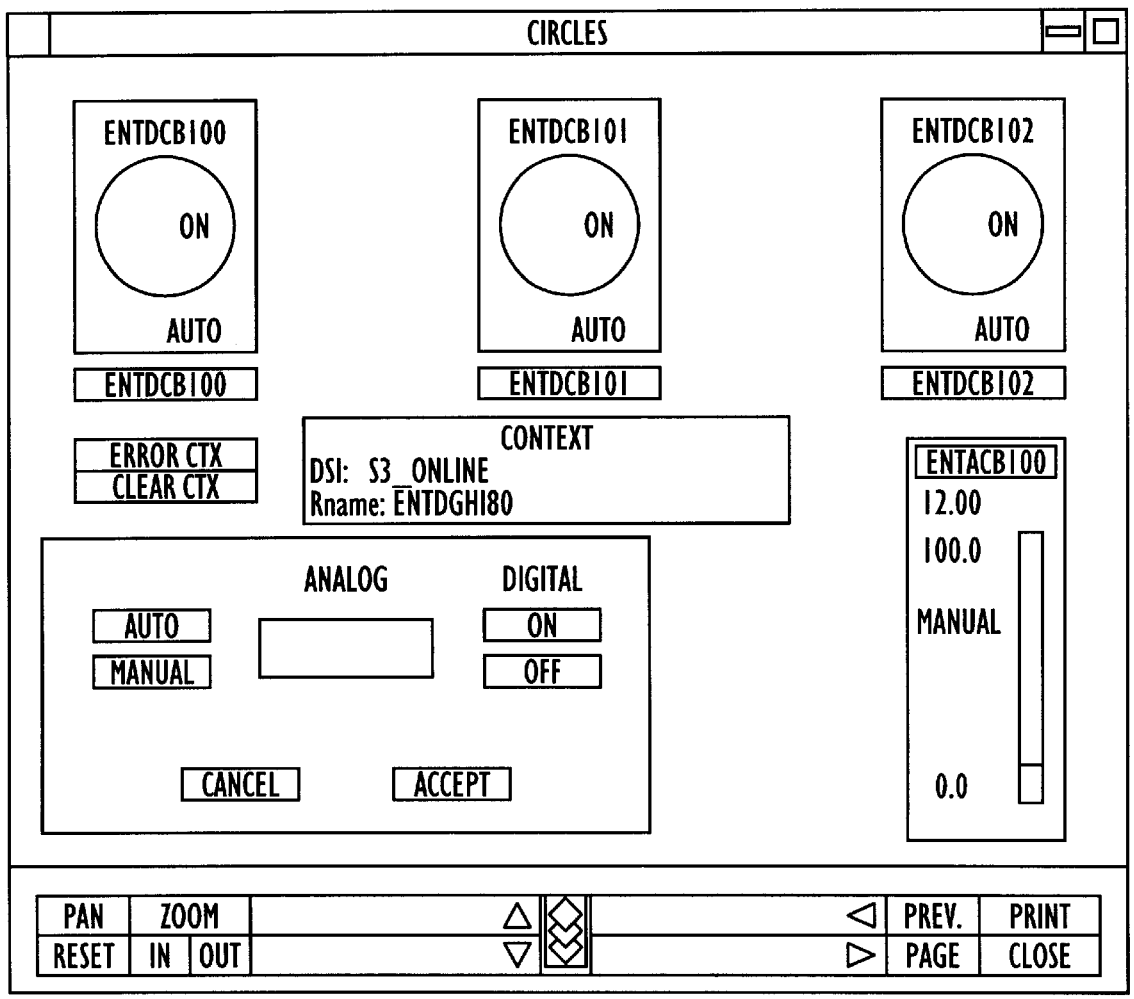
FIG. 25 is a diagram illustrating a completed model using SGOs in the Run-Time environment of the computer implemented object oriented visualization system.

The CIRCLES demo graphic is divided into 4 areas, as illustrated in FIG. 25:

devices, located at the top of the model;
  context, located in the center of the model;
  analog loop, located in the bottom right hand corner of the model
  control, located in the bottom left hand corner of the model.

The device area consists of three instances of the CIRCLE_SGO submodel. CIRCLE_SGO shows the following digital device information for ENTDCB100, ENTDCB101 and ENTDCB102 devices:

EPN
  A circle with the color changing based on the device status. Status colors display default device colors.
  Text displaying the device status.
  Auto/manual mode of the device.

Layered on top of each circle in CIRCLE, SGO is the gismo VSN_AB_POPUP is clicked upon, it will pop up a small control panel CIRCLE_CONTROL for that device, allowing the user to turn the device on or off, or set it to AUTO or MANUAL. Located under each CIRCLE_SGO is a push button labeled with the device's EPN. When the push button is clicked upon, it will set the context to the device EPN written on the button.

The context area presents the tag currently stored in context. (The context window is an instance of VIS_CONTEXT.) To clear the context, the user clicks on the push button labeled Clear CTX. When the Clear CTX button is clicked upon, the information displayed in CONTEXT is removed. The analog loop section of the model displays an instance of a simplified faceplate. This faceplate displays the following information for the analog loop ENTACB100:

EPN
  Current measurement value
  Bar graph for the current measurement value
  Display range low limit
  Display range high limit
  Alarm status
  EGU tag Located in the faceplate VALUE area is another VSN_AB_POPUP gismo. When it is clicked upon, it will pop up the FP_CONTROL command box for ENTACB100. The FP_CONTROL provides an operator command box that supports mouse driven operator control for analog loops. To close the pop-up with the cursor inside the pop-up window, the user clicks on the right mouse button. There are two options to control the points displayed. The first option is to use the point's pop-up faceplate or command box. The second is to use the control area.

The control area offers three types of control:
  Auto/manual for both analog and device points
  Setpoint control for analog loops
  On and Off commands for devices All of the commands in the control area will be sent to the tag stored in context. Hence, the first step to issuing a command is to set the context. To set the context, select one of the device EPN push buttons, or click on ENTACB100 in the faceplate area. Confirm the context is correct by verifying it being displayed in the CONTEXT window.

To perform Auto/Manual control:
  Click on either the "Auto" or "Manual" push button to change the control status of the point from automatic to manual or from manual to automatic. Click on either the "Accept" button to send the command to the server.

OR

Click on the "Cancel" button to cancel the command.
  If you click "Accept", a dialog box will pop up asking you to confirm the action ("Yes" or "No"). "Cancel" requires no such confirmation.

To perform Analog control:
  Click on the text entry box located below "Analog".
  Enter the new setpoint with a carriage return. Click on either the "Accept" button to send the command to the server.

OR

Click on the "Cancel" button to cancel the command. If you click "Accept", a dialog box will pop up asking you to confirm the action ("Yes" or "No"). "Cancel" requires no such confirmation.
  The text entry field does not clear itself once the carriage return is hit. The old setpoint value must be deleted before a new setpoint is entered.

To issue an On Command to a device:
  Click on the "On" push button. Click on either the "Accept" button to send the command to the server.

OR

Click on the "Cancel" button to cancel the command.
  If you click "Accept", a dialog box will pop up asking you to confirm the action ("Yes" or "No"). "Cancel" requires no such confirmation.

To issue an Off Command to a device:
  Click on the "Off" push button. Click on either the "Accept" button to send the command to the server.

OR

Click on the "Cancel" button to cancel the command.
  If you click "Accept", a dialog box will pop up asking you to confirm the action ("Yes" or "No"). "Cancel" requires no such confirmation.

Listed below are all the gismos used and the associated push button labels or location of the gismo.

| GISMO | Button Label/Location |
|---|---|
| VSN_P3_SETCTX | ENTDCB100 |
| VSN_P3_SETCTX | ENTDCB101 |
| VSN_P3_SETCTX | ENTDCB102 |
| VSN_AB_POPUP | CIRCLE_CONTROL pop-up |
| VSN_P3_CLRCTX | Clear CTX |
| VSN_AB_SETCTX | ENTACB100 |
| VSN_PE_SETVAL | Auto |
| VSN_P3_SETVAL | Manual |
| VSN_P3_SETVAL | On |
| VSN_P3_SETVAL | Off |
| VSN_PE_CNCLDEP | Cancel |
| VSN_P3_SNDCTX | Accept |
| VSN AB_POPUP | FP_CONTROL pop-up |

NAVIGATOR

Figure 26:
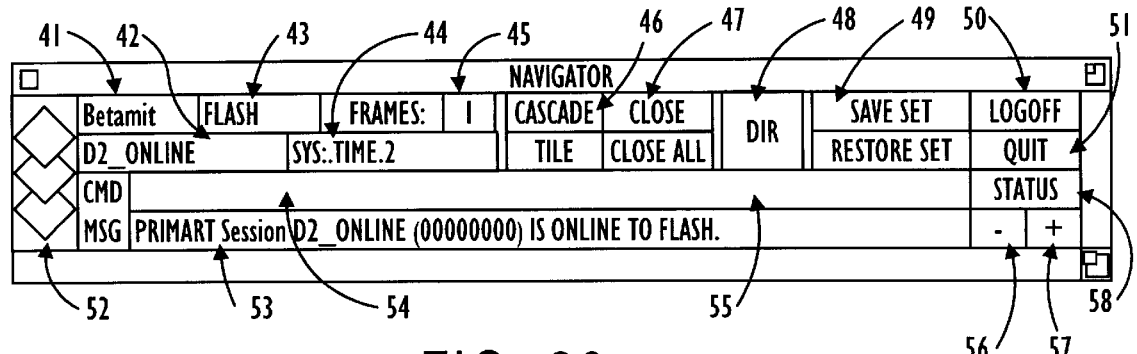
FIG. 26 is a diagram illustrating the navigator functions of the Run-Time environment of the computer implemented object oriented visualization system.

The Navigator provides overall management of the VRT process. The Navigator is a control panel for the VRT process. It is shown in FIG. 26 and provides the following functions:

41. User Name—Name of the user currently logged in. On a D/3 system, this field indicates the console number when running VRT from a PVX window.

42. Server Name—Name of the dataserver for the currently active context. A context specifies a tag and attribute from a given dataserver.
43. Node Name—This indicates the node name running the VRT process.
44. Context—A tag and attribute reference for the server shown in item 2. The context is used when sending commands to the process database.
45. Number of Frames—Number of frames currently active.
46. Cascade & Tile—These functions perform screen management for currently active frames. The Cascade button causes all the computer implemented object oriented system models currently displayed to be displayed one below the other cascading down the screen. The position and size of each frame depends on configuration parameters. The Tile button causes all the computer implemented object oriented system models currently displayed to be sized and positioned in a window pane fashion.
47. Close Frames—The Close function closes the currently active frame. (The current frame has a blue border in the bottom portion of the display behind the control panel.) "Close All" closes all currently active frames.
48. Directory—Invokes the Directory window. The directory provides a list of all registered models. If the keyboard control key is held down during this operation, the directory listing also displays models compiled with the -h (Hidden) switch.
49. Save Sets—A frame set consists of one or more frames arranged on the display and saved as a group. Frame sets are accessed using the Save Sets dialog window which is activated using the Save Sets button. The "Restore Set" button recalls the most recently activated frame set. When a frame set is displayed, the individual frames are positioned exactly where they were originally located when the set was stored. Any frames previously opened are closed automatically.
50. Logoff—Log out the current user. Closes all active displays.
51. Quit—End the VRT session.
52. Logo—computer implemented object oriented system logo. This button may be used in future releases.
53. System Messages—Messages from VRT and Server sessions appear here.
54. Keyboard Commands—Echo area for keyboard commands.
55. Alert Signal—Flashes red to indicate serious system problems. Refer to the System Messages area for further information.
56. Erase Messages—Clears the System Message and Keyboard Echo areas.
57. Message History—Invokes the message history window. All messages that appear in this System Messages area of the Navigator are written to this window and to an optional log file.
58. Server Status—Displays the current dataserver connection and node name.

Frame

Figure 27:
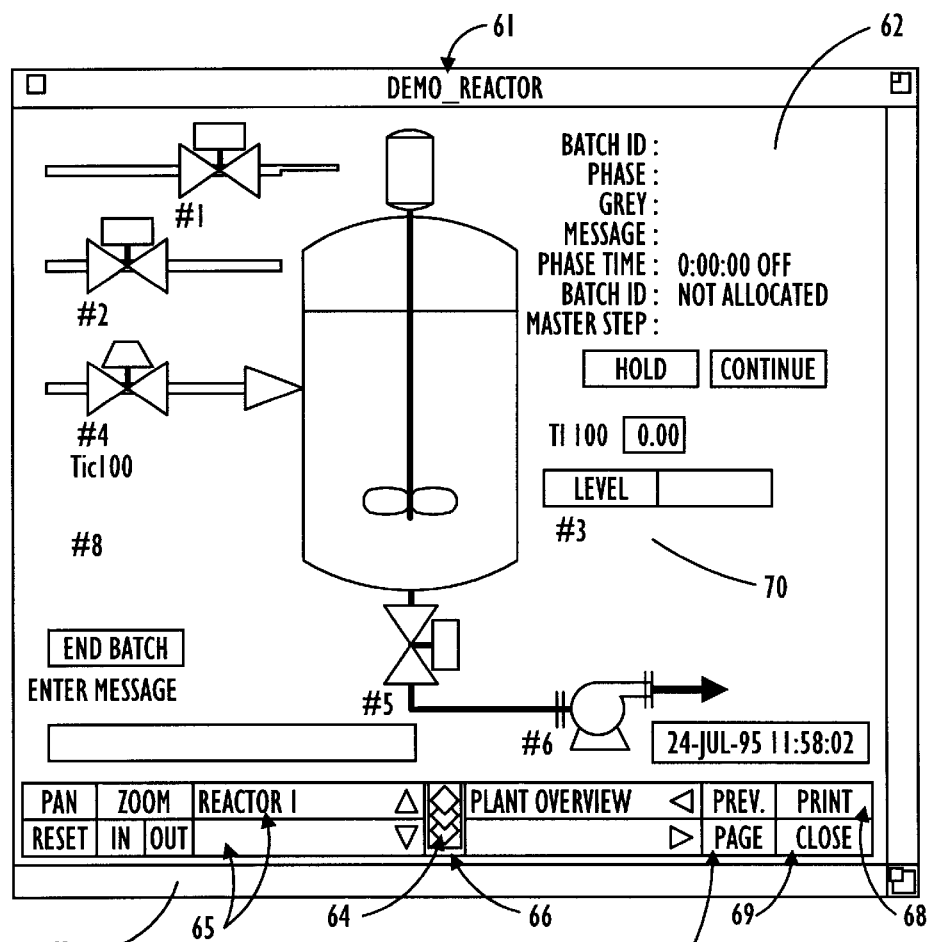
FIG. 27 is a diagram illustrating a demo reactor SGO in a model within the Run-Time environment of the computer implemented object oriented visualization system.

A frame is the working view of a dynamic Model. A single Navigator supports up to 32 Frames. Each frame contains a control panel that appears in the bottom portion of the frame window. The frame's control panel provides the following functionality which is illustrated in FIG. 27.

61. Model Name—The name of the computer implemented object oriented system model displayed in this frame.
62. Computer implemented object oriented system Model—Any registered model created by the computer implemented object oriented system editor.
63. Zoom Functions—Zoom functions are provided as follows:
    Zoom—When zoom is active, any portion of the model can be enlarged by dragging the mouse over the desired area. Upon release of the primary mouse button, the selected area will be enlarged to fill the current frame.
    Zoom In—Enlarge the current model by factor of 1.6.
    Zoom Out—Reduce the current model by factor of 1.6.
    Reset—Reset zoom and pan functions and display original model. If the control key is held down while clicking on the Reset button, all popup displays associated with this frame will be closed.
    Pan—Display portions of a zoomed model that are not currently visible. When the pan function is active, the current view of the model can be changed by dragging the model using the mouse and primary mouse button.
64. Show Action Boxes—Displays action boxes areas on the current model using a dashed rectangle. A mouse click within the action box executes the previously defined function. Click again to hide the action boxes.
65. Display Navigation Keys—Up, down, left and right. These buttons display a new computer implemented object oriented system model in the current frame. The name of the model is displayed on the button. Associated displays are defined at model creation using the computer implemented object oriented system editor.
66. Alert Signal—Flashes red when the dataserver connection is lost. Refer to the Navigator message area for further information.
67. Previous/Page—The Previous button recalls the 8 most recent models displayed in the current frame. The Page button displays a new model in place of the existing model. The page button is model specific and defined using the computer implemented object oriented system editor.
68. Print—Create a Postscript image of the current model. Files can be spooled to a print queue by specifying a command.
69. Close—Close the current frame.
70. Select Number—The select number identifies action box GISMOS which may be placed in a model. The number indicates a Quick Select or Function key accelerator which may be used to activate the GISMO in place of a mouse click.

The following table illustrates attributes and values of one of the existing standard servers that may be associated with GOs used to create an SGO:

TABLE

| Attribute | Description | Legal Values |
| --- | --- | --- |
| ABSPRESS | absolute pressure value | Integer value returned by the RTU |
| ABSPRESSFLG | absolute pressure type flag | Integer value returned by the RTU |
| ABSPRESSUSE | absolute pressure in use | Integer value returned by the RTU |
| ADI | alarm destination index | Integer value in the range 0 through 255 |
| ALARMACK | alarm acknowledged | Integer value returned by the RTU |
| ALARMCOND | alarm condition | Integer value returned by the RTU |
| ALARMDBND | alarm deadband | Floating point value greater than 0.00000 |
| ALARMGROUP | alarm group | Integer value in the range 0 through 255 |
| ALARMPRIOR | alarm priority | Integer value returned by the RTU |
| ALGSEL | conversion disable | Integer value in the range 0 through 1 |
| ARGON | argon value | Integer value returned by the RTU |
| ARGONFLG | argon value type flag | Integer value returned by the RTU |
| ARGONUSE | argon value in use | Integer value returned by the RTU |
| AUTOMAN | auto/manual state | Integer value in the range 0 through 1 |
| AVAILABLE | point availability | Integer value returned by the RTU |
| BRAKET | braket evaluation code | Integer value returned by the RTU |
| CDIOXDE | carbon dioxide value | Integer value returned by the RTU |
| CDIOXIDEFLG | carbon dioxide val type flag | Integer value returned by the RTU |
| CDIOXIDEUSE | carbon dioxide val in use | Integer value returned by the RTU |
| CMONOXIDE | carbon monoxide value | Integer value returned by the RTU |
| CMONOXIDEFLG | carbon monoxide type flag | Integer value returned by the RTU |
| CMONOSIDEUSE | carbon monoxide in use | Integer value returned by the RTU |
| CONINDEX | console enable index | Integer value in the range 0 through 255 |
| DECANE | n-decane value | Integer value returned by the RTU |
| DECANEFLG | n-decane type flag | Integer value returned by the RTU |
| DECANEUSE | n-decane in use | Integer value returned hy the RTU |
| DENSDBD | relative density deadband | Floating point value in the range 0.000000 through 100.000000 |
| DENST | relative density ref temp | Integer value returned by the RTU |
| DENSTFLG | relative density ref type flag | Integer value returned by the RTU |
| DENSTUSE | relative density ref in use | Integer value returned by the RTU |
| DENSV | current value density | Floating point value with no range restrictions |
| DESC | descriptor string | String value |
| DESC1 | descriptor substring (not supported in S/3 Dataserver) | String value |
| DESC2 | descriptor substring (not supported in S/3 Dataserver) | String value |
| DESC3 | descriptor substring (not supported in S/3 Dataserver) | String value |
| DESC4 | descriptor substring (not supported in S/3 Dataserver) | String value |
| DISPHI | high display range | Floating point value greater than DISPLO |
| DISPLO | low display range | Floating point value less than DISPHI |
| EGUHI | EGU range high limit | Floating point value less than EGULO |
| EGULO | EGU range low limit | Floating point value less than EGUHI |
| EGUTAG | EGU tag | String value |
| ERRCODE | error code | String value returned by the RTU |
| ETHANE | ethane value | Integer value returned by the RTU |
| ETHANEFLG | ethane type flag | Integer value returned by the RTU |
| ETHANEUSE | ethane in use | Integer value returned by the RTU |
| EXCPVAL | exception value | Floating point value greater than 0.000000 |
| GASDBD | gas comp. fraction deadband | Floating point value in the range 0.000000 through 100.000000 |
| GLALARMENAB | global alarm enable status | Integer value in the range 0 through 1 |
| HEATDBD | heating value deadband | Floating point value in the range 0.000000 through 100.000000 |
| HEATSCAL | heating value scaling mult. | Floating point value in the range 0.000000 through 100.000000 |
| HEATVAL | gross heating value | Floating point value with no range restrictions |
| HEATVALT | heating value ref. temperature | Floating point value with no range restrictions |
| HELIUM | helium value | Integer value returned by the RTU |
| HELIUMFLG | helium type flag | Integer value returned by the RTU |
| HELIUMUSE | helium in use | Integer value returned by the RTU |
| HEPTANE | heptane value | Integer value returned by the RTU |
| HEPTANEFLG | heptane type flag | Integer value returned by the RTU |
| HEPTANEUSE | helium in use | Integer value returned by the RTU |
| HEXANE | heptane value | Integer value returned by the RTU |
| HEXANEFLG | hexane type flag | Integer value returned by the RTU |
| HEXANEUSE | hexane in use | Integer value returned by the RTU |
| HIALARMLIM | high alarm limit | Floating point value less than HIHIALARMLIM and greater than LOALARMLIM |
| HIALARMPRI | priority of high alarm | Integer value in the range 0 through 3 |
| HSULFIDE | hydrogen sulfide value | Integer value returned by the RTU |

TABLE-continued

| Attribute | Description | Legal Values |
|---|---|---|
| HSULFIDEFLG | hydrogen sulfide type flag | Integer value returned by the RTU |
| HSULFIDEUSE | hydrogen sulfide in use | Integer value returned by the RTU |
| HTRIGCRI | critical alarm trigger | Integer value in the range 0 through 31 |
| HTRIGNF | informational alarm trigger | Integer value in the range 0 through 31 |
| HTRIGURG | urgent alarm trigger | Integer value in the range 0 through 31 |
| HYDROGEN | hydrogen value | Integer value returned by the RTU |
| HYDROGENFLG | hydrogen type flag | Integer value returned by the RTU |
| HYDROGENUSE | hydrogen in use | Integer value returned by the RTU |
| IBUTANE | i-butane value | Integer value returned by the RTU |
| IBUTANEFLG | i-butane type flag | Integer value returned by the RTU |
| IBUTANEUSE | i-butane in use | Integer value returned by the RTU |
| IPENTANE | i-pentane value | Integer value returned by the RTU |
| IPENTANEFLG | i-pentane type flag | Integer value returned by the RTU |
| IPENTANEUSE | i-pentane in use | Integer value returned by the RTU |
| LOALARMLIM | low alarm limit | Floating point value less than HIALARMLIM and greater than LOLOALARMLIM |
| LOALARMPRI | priority of low alarm | Integer value in the range 0 through 3 |
| LOLOALARMLIM | low-low alarm limit | Floating point value less than LOLARMLIM |
| LOLOALARMPRI | priority of low-low limit | Integer value in the range 0 through 3 |
| METHANE | methane value | Integer value returned by the RTU |
| METHANEFLG | methane type flag | Integer value returned by the RTU |
| METHANEUSE | methane in use | Integer value returned by the RTU |
| METHOD | calculation method | Integer value in the range 0 through 3 |
| METHOD | actual calculation method | Integer value returned by the RTU |
| NAME | EPN name (not supported by S/3 Dataserver) | String value returned by the RTU |
| NBUTANE | n-butane value | Integer value returned by the RTU |
| NBUTANEFLG | n-butane type flag | Integer value returned by the RTU |
| NBUTANEUSE | n-butane in use | Integer value returned by the RTU |
| NITROGEN | nitrogen value | Integer value returned by the RTU |
| NITROGENFLG | nitrogen type flag | Integer value returned by the RTU |
| NITROGENUSE | nitrogen in use | Integer value returned by the RTU |
| NONANE | n-nonane value | Integer value returned by the RTU |
| NONANEFLG | n-nonane type flag | Integer value returned by the RTU |
| NONANEUSE | n-nonane in use | Integer value returned by the RTU |
| NPENTANE | n-pentane value | Integer value returned by the RTU |
| NPENTANEFLG | n-pentane type flag | Integer value returned by the RTU |
| NPENTANEUSE | n-pentane in use | Integer value returned by the RTU |
| OCTANE | n-octane value | Integer value returned by the RTU |
| OCTANEFLG | n-octane type flag | Integer value returned by the RTU |
| OCTANEUSE | n-octane in use | Integer value returned by the RTU |
| OXYGEN | oxygen value | Integer value returned by the RTU |
| OXYGENFLG | oxygen type flag | Integer value returned by the RTU |
| OXYGENUSE | oxygen in use | Integer value returned by the RTU |
| PNUM | point number | Integer value returned by the RTU |
| PRENAB | periodic report enable flag | Integer value returned by the RTU |
| PRESDBD | pressure deadband | Floating point value in the range of 0.000000 through 100.000000 |
| PRESSCAL | pressure scaline multiplier | Floating point value in the range of 0.000000 through 100.000000 |
| PRESSURE | pressure value | Integer value returned by the RTU |
| PRESSUREFLG | pressure type flag | Integer value returned by the RTU |
| PRESSUREUSE | pressure in use | Integer value returned by the RTU |
| PROPANE | propane type flag | Integer value returned by the RTU |
| PROPANEUSE | propane in use | Integer value returned by the RTU |
| PTYPE | point type | Integer value returned by the RTU |
| QTAG | quaiity tag string | String value |
| QUELALARMPRI | questionable alarm priority | Integer value in the range 0 through 3 |
| RELP | ref. heating val pressure | Integer value returned by the RTU |
| RELPFLG | ref. heat val pressure type flag | Integer value returned by the RTU |
| RELPUSE | ref. heat val pressure in use | Integer value returned by the RTU |
| REMLOC | remote/local status | Integer value in the range 0 through 1 |
| REPORT | backup update report rate | Integer value; legal range of 0.255 for host CALC points, 0–2550 for all others |
| ROCALARMLIM | rate of change alarm limit | Floating point value greater than 0.000000 |
| ROCALARMPRI | rate of change alarm priority | Integer value in the range of 0 through 3 |
| RPHASE | report phase | Integer value in the range 0 through 255 |
| RTU | RTU where point is defined | Integer value returned by the RTU |
| RXENAB | report-by-exception enable | Integer value in the range 0 through 1 |
| SAUTOMAN | auto/manual state | Integer value returned by the RTU |
| SCANENAB | scan enable | Integer value in the range 0 through 1 |
| SCANINT | scan interval | Integer value in the range 0 through 255 |
| SG | specific gravity value | Floating point value with no range restrictions |
| SPHASE | scan phase | Integer value in the range 0 through 255 |
| STATUS | current status word | Integer value returned by the RTU |

TABLE-continued

| Attribute | Description | Legal Values |
| --- | --- | --- |
| TEMP | temperature value | Integer value returned by the RTU |
| TEMPDBD | temperature deadband | Floating point value in the range 0.000000 through 100.000000 |
| TEMPFLG | temperature type flag | Integer value returned by the RTU |
| TEMPTYP | temperature scale | Integer value in the range 0 through 3 |
| TEMPUSE | temperature in use | Integer value returned by the RTU |
| VALUE | current value | Floating point value with no range restrictions |
| WATER | h20 value | Integer value returned by the RTU |
| WATERFLG | h20 type flag | Integer value returned by the RTU |
| WATERUSE | h20 in use | Integer value returned by the RTU |
| Z | compressibility value | Floating point value with no range restrictions |
| ZB | base compressibility value | Floating point value with no range restrictions |

It should be noted that the above computer implemented process steps described above are implemented by hardware, i.e., any standard computer system capable of implementing the above functions as described herein. Accordingly, each step of the present invention typically generates a physical electrical signal which represents a physical result of a specific step described in the flow charts. The flow charts represent physical electrical signals which are generated and used in subsequent steps of the process. Therefore, the flowcharts represent the transforming of physical electrical signals representing physical characteristics and quantities into other physical electrical signals also representing transformed physical characteristics.

A standard microprocessor system capable of performing the functions described for each of the above individual components are may also be used. Additional details relating to multiple instruction multiple data multiprocessor types of computer architectures are disclosed in greater detail in, for example, U.S. Pat. No. 5,163,131; Boxer, A., Where Buses Cannot Go, IEEE Spectrum, February 1995, pp. 41–45; and Barroso, L. A. et al., RPM: A Rapid Prototyping Engine for Multi-Processor Systems, IEEE Computer, February 1995, pp. 26–34, all of which are incorporated herein by reference. Alternatively, each of the above circuits may also represent computer software subroutines in a large computer program providing a computer implemented performance analysis process in accordance with the present invention.

The computer implemented process instructing the computer to perform the model simulation and execution process described above may be stored on a floppy diskette tangible medium. of course, other tangible mediums may also be used such as a read only memory, a random access memory, hard disk drive or other programmable and erasable memories.

Although a number of arrangements of the invention have been mentioned by way of example, it is not intended that the invention be limited thereto. Accordingly, the invention should be considered to include any and all configuration, modifications, variations, combinations or equivalent arrangements falling within the scope of the following claims.

What is claimed is:

1. A computer implemented method for executing a simulation model describing characteristics of a physical system, comprising the steps of:

(a) defining a graphical object (GO) representing static properties of the physical system;

(b) defining dynamic variables of the physical system;

(c) binding the dynamic variables of the physical system to a physical data source providing dynamic properties of the physical system over time as values for the dynamic variables; and (d) executing the simulation model and displaying the graphical object with the dynamic properties of the physical system.

2. A computer implemented method according to claim 1, wherein said executing step (d) further comprises the step of displaying the graphical object with the dynamic properties of the physical system by compiling only the dynamic variables of the physical system.

3. A computer implemented method according to claim 1, wherein said executing step (d) further comprises the step of displaying the graphical object with the dynamic properties of the physical system by compiling only the dynamic variables of the physical system and not the static properties, thereby enhancing processing speed of the computer implemented method.

4. A computer implemented method according to claim 1, wherein said executing step (d) further comprises the step of displaying the graphical object with the dynamic properties of the physical system by retrieving only current dynamic properties of the physical system from the data source as the values of the dynamic variables.

5. A computer implemented method according to claim 1, wherein said executing step (d) further comprises the step of displaying the graphical object with the dynamic properties of the physical system by retrieving only current dynamic properties of the physical system from the data source as the values of the dynamic variables and not the static properties, thereby enhancing processing speed of the computer implemented method.

6. A computer implemented method according to claim 1, wherein said binding step (c) further comprises the step of binding the dynamic variables of the physical system to the physical data source, the dynamic variables including attribute and tag variables, the tag variable representing a pointer and the attribute variable representing a field associated with the pointer, the tag and attribute variables being utilized by the computer implemented method for retrieving the dynamic properties from the data source as the values for the dynamic variables.

7. A computer implemented method according to claim 6, wherein the tag and attribute variables are assigned independently of each other and are utilized by the computer implemented method for retrieving the dynamic properties from the data source as the values for the dynamic variables.

8. A computer implemented method according to claim 7, wherein the simulation model optionally shares one or more of the tag variables with other simulation models.

9. A computer implemented method according to claim 6, wherein said binding step (c) further comprises the step of changing the tag variable to the pointer during a run-time process of the simulation model.

10. A computer implemented method according to claim 1,
wherein the data source comprises a data source system with nodes, the data source system including directory information for each of the nodes, and
wherein said method further comprising, after said defining step (b), the step of registering the simulation model with the data source to validate the simulation model with the data source and to update the directory information for each of the nodes in the data source.

11. A computer implemented method according to claim 1, wherein said binding step (c) further comprises the step of binding the dynamic variables of the physical system to the physical data source and associating the dynamic variables of the physical process with the dynamic properties and displaying the simulation model in response to changes in the dynamic variables.

12. A computer implemented method according to claim 1, wherein said binding step (c) generates a smart graphical object (SGO).

13. A computer implemented method according to claim 12, wherein once the smart graphical object (SGO) has been generated, only the tag variables need be specified to automatically link the dynamic variables to the data source.

14. A computer implemented method according to claim 1, wherein said defining step (b) further comprising the step of defining the dynamic variables of the physical system including attribute and tag variables, the tag variable representing a pointer and the attribute variable representing a field associated with the pointer, the tag and attribute variables being utilized by the computer implemented method for retrieving the dynamic properties from the data source as the values for the dynamic variables.

15. A computer implemented method according to claim 14, wherein when the tag variable is unknown for said defining step (b), a token is defined instead of the tag variable, and the token is assigned to the tag variable during said binding step (c).

16. A computer implemented method according to claim 14, wherein said binding step (c) promotes reuse of the static and dynamic properties of the simulation model.

17. A computer implemented method for linking dynamic variables including tag and attribute variables from a dataserver to a graphical object, the tag variable representing a pointer and the attribute variable representing a field associated with the pointer, the tag and attribute variables being utilized by the computer implemented method for retrieving dynamic properties from the data source as the values for the dynamic variables, the simulation model describing characteristics of a physical system, comprising the steps of:
(a) defining a graphical object (GO) representing static properties of the physical system and the dynamic variables of the physical system; and
(b) binding the dynamic variables of the physical system to the data server having access to a data source, associating the dynamic variables including the tag and attribute variables and an update rate to the data source, and retrieving the dynamic properties from the data source responsive to the update rate and attribute and tag variables.

18. A computer implemented method according to claim 17, wherein when the tag variable is unknown for said defining step (a), a token is defined instead of the tag variable, and the token is assigned to the tag variable during said binding step (b).

19. A computer architecture for executing a simulation model, the simulation model describing characteristics of a physical system, comprising:
an editor processor prompting a user to define a graphical object (GO) representing static properties of the physical system, and prompting the user to define dynamic variables of the physical system;
a compiler operatively connected to said editor processor, said compiler binding the dynamic variables of the physical system to a physical data source, the physical data source providing dynamic properties of the physical system over time as values for the dynamic variables; and
a run time processor, operatively connected to said compiler, executing the simulation model and displaying the graphical object with the dynamic properties of the physical system.

20. A computer architecture according to claim 19,
wherein the data source comprises a data source system with nodes, the data source system including directory information for each of the nodes, and
wherein said computer architecture further comprises, a register processor, operatively connected to said editor processor, said register processor registering the simulation model with the data source to validate the simulation model with the data source and to update the directory information for each of the nodes in the data source prior to compilation of the simulation model.

21. A computer implemented method for linking dynamic variables from a data server to a graphical object, the computer implemented method retrieving dynamic properties from a data source as values for the dynamic variables, comprising the steps of:
(a) defining a graphical object (GO) representing static properties of a physical system and dynamic variables of the physical system;
(b) binding the dynamic variables of the physical system to the data server having access to the data source, associating the dynamic variables, and retrieving the dynamic properties from the data source responsive to predetermined criteria to simulate the dynamic properties of the physical system;
(c) simulating the dynamic properties of the physical system responsive to the retrieved dynamic properties in said step (b); and
(d) displaying the combination of the static properties of the physical system defined in said step (a), and the dynamic properties of the physical system simulated in said step (c).

22. A computer implemented method for linking dynamic variables from a data server to a graphical object, the computer implemented method retrieving dynamic properties from a data source as values for the dynamic variables, comprising the steps of:
(a) defining a graphical object (GO) representing static properties of a physical system and dynamic variables of the physical system;
(b) binding the dynamic variables of the physical system to the data server having access to the data source, associating the dynamic variables, and retrieving the dynamic properties from the data source responsive to predetermined criteria to simulate the dynamic properties of the physical system.

* * * * *